US012787730B2

(12) United States Patent
Spurlin et al.

(10) Patent No.: US 12,787,730 B2
(45) Date of Patent: Nov. 3, 2026

(54) ELECTRODEPOSITION OF COBALT TUNGSTEN FILMS

(71) Applicant: Lam Research Corporation, Fremont, CA (US)

(72) Inventors: Tighe A. Spurlin, Portland, OR (US); Edward C. Opocensky, Aloha, OR (US); Zhange Feng, Naperville, IL (US); Matthew A. Rigsby, Tualatin, OR (US); Jonathan David Reid, Sherwood, OR (US)

(73) Assignee: Lam Research Corporation, Fremont, CA (US)

( * ) Notice: Subject to any disclaimer, the term of this patent is extended or adjusted under 35 U.S.C. 154(b) by 1204 days.

(21) Appl. No.: 17/596,534

(22) PCT Filed: Jun. 23, 2020

(86) PCT No.: PCT/US2020/039150
§ 371 (c)(1),
(2) Date: Dec. 13, 2021

(87) PCT Pub. No.: WO2020/263837
PCT Pub. Date: Dec. 30, 2020

(65) Prior Publication Data
US 2022/0102209 A1 Mar. 31, 2022

Related U.S. Application Data

(60) Provisional application No. 62/868,441, filed on Jun. 28, 2019.

(51) Int. Cl.
*H10W 20/00* (2026.01)
*C25D 3/56* (2006.01)
(Continued)

(52) U.S. Cl.
CPC .......... *H10W 20/057* (2026.01); *C25D 3/562* (2013.01); *C25D 5/02* (2013.01); *C25D 5/34* (2013.01);
(Continued)

(58) Field of Classification Search
CPC ......... H01L 21/76879; H01L 21/76873; H01L 21/76882; H01L 23/53261; H01L 21/2885;
(Continued)

(56) References Cited

U.S. PATENT DOCUMENTS 2,017,646 A 10/1935 Henri et al.
4,439,283 A 3/1984 Verberne et al.
(Continued)

FOREIGN PATENT DOCUMENTS

CN 1505141 A 6/2004
CN 1618601 A 5/2005
(Continued)

OTHER PUBLICATIONS

CN Office Action dated Jan. 12, 2024 in CN Application No. 202080046980.2 with English Translation.
(Continued)

*Primary Examiner* — Eva Y Montalvo
(74) *Attorney, Agent, or Firm* — Weaver Austin Villeneuve & Sampson LLP

(57) ABSTRACT

Tungsten-containing metal films may be deposited in recessed features of semiconductor substrates by electrodeposition. The tungsten-containing metal film is electrodeposited under conditions so that the tungsten-containing metal film is free or substantially free of oxide. Conditions are optimized during electrodeposition for pH, tungsten concentration, and current density, among other parameters. The tungsten-containing metal film may include cobalt
(Continued)

tungsten alloy, cobalt nickel tungsten alloy, or nickel tungsten alloy, where a tungsten content in the tungsten-containing metal film is between about 1-20 atomic %.

12 Claims, 13 Drawing Sheets

(51) Int. Cl.

| | |
|---|---|
| ***C25D 5/02*** | (2006.01) |
| ***C25D 5/34*** | (2006.01) |
| ***C25D 5/50*** | (2006.01) |
| ***C25D 7/12*** | (2006.01) |
| ***C25D 17/00*** | (2006.01) |
| ***C25D 21/12*** | (2006.01) |
| ***H10W 20/44*** | (2026.01) |

(52) U.S. Cl.
CPC ............... *C25D 5/50* (2013.01); *C25D 7/123* (2013.01); *C25D 17/001* (2013.01); *C25D 21/12* (2013.01); *H10W 20/043* (2026.01); *H10W 20/059* (2026.01); *H10W 20/4446* (2026.01)

(58) Field of Classification Search
CPC ......... H01L 21/76862; H01L 21/76864; H01L 21/76877; H01L 23/53209; C25D 3/562; C25D 5/02; C25D 5/34; C25D 5/50; C25D 7/123; C25D 17/001; C25D 21/12; C25D 17/002; C25D 17/007; C25D 17/02; C25D 17/12; C25D 21/06; C25D 21/10; C25D 5/18
See application file for complete search history.

(56) References Cited

U.S. PATENT DOCUMENTS

| | | | |
|---|---|---|---|
| 4,595,462 | A | 6/1986 | Vangaever et al. |
| 6,036,833 | A | 3/2000 | Tang et al. |
| 6,709,523 | B1 | 3/2004 | Toshima et al. |
| 6,930,391 | B2 | 8/2005 | Kloster et al. |
| 8,084,339 | B2 | 12/2011 | Antonelli et al. |
| 9,777,386 | B2 | 10/2017 | Doubina et al. |
| 10,329,683 | B2 | 6/2019 | Brogan et al. |
| 11,078,591 | B2 | 8/2021 | Brogan et al. |
| 2001/0003063 | A1 | 6/2001 | Hu et al. |
| 2003/0051665 | A1 | 3/2003 | Zhao et al. |
| 2003/0143837 | A1 * | 7/2003 | Gandikota ........ H01L 21/76868 438/653 |
| 2004/0108136 | A1 | 6/2004 | Andricacos et al. |
| 2005/0127518 | A1 * | 6/2005 | Cabral, Jr. ........ H01L 21/76877 257/E21.585 |
| 2008/0236441 | A1 | 10/2008 | Nobe |
| 2009/0188805 | A1 | 7/2009 | Moffat et al. |
| 2009/0255820 | A1 | 10/2009 | Buttard |
| 2010/0032310 | A1 | 2/2010 | Reid et al. |
| 2012/0328904 | A1 | 12/2012 | Baskin et al. |
| 2014/0224661 | A1 | 8/2014 | Spurlin et al. |
| 2014/0256127 | A1 | 9/2014 | Spurlin et al. |
| 2015/0053565 | A1 | 2/2015 | Zhu et al. |
| 2015/0072538 | A1 | 3/2015 | Spurlin et al. |
| 2015/0126030 | A1 | 5/2015 | Yang et al. |
| 2015/0255334 | A1 | 9/2015 | Yang et al. |
| 2015/0270133 | A1 | 9/2015 | Lam et al. |
| 2015/0357195 | A1 | 12/2015 | Lam et al. |
| 2016/0258078 | A1 | 9/2016 | Thorum et al. |
| 2016/0273117 | A1 | 9/2016 | Doubina et al. |
| 2017/0256463 | A1 | 9/2017 | Bailey, III et al. |
| 2018/0119305 | A1 | 5/2018 | Brogan et al. |
| 2019/0271094 | A1 | 9/2019 | Brogan et al. |
| 2020/0040478 | A1 | 2/2020 | Commander et al. |
| 2020/0050578 | A1 | 2/2020 | Mopur et al. |
| 2023/0178430 | A1 | 6/2023 | Doubina et al. |

FOREIGN PATENT DOCUMENTS

| | | | |
|---|---|---|---|
| CN | 101395720 | A | 3/2009 |
| CN | 101645401 | A | 2/2010 |
| CN | 103643265 | A | 3/2014 |
| CN | 105702630 | A | 6/2016 |
| CN | 106463368 | A | 2/2017 |
| CN | 109844930 | A | 6/2019 |
| EP | 2671969 | A1 | 12/2013 |
| KR | 100772320 | B1 | 10/2007 |
| KR | 20110063810 | A | 6/2011 |
| KR | 20140005211 | A | 1/2014 |
| KR | 20140043693 | A | 4/2014 |
| KR | 20140109834 | A | 9/2014 |
| KR | 20150024292 | A | 3/2015 |
| KR | 20160108174 | A | 9/2016 |
| KR | 20160112980 | A | 9/2016 |
| KR | 20160113007 | A | 9/2016 |
| TW | 201145493 | A | 12/2011 |
| WO | WO-03065423 | A2 | 8/2003 |
| WO | WO-2004040041 | A1 | 5/2004 |

OTHER PUBLICATIONS

CN Office Action dated Jul. 26, 2024 in CN Application No. 202080046980.2 with English translation.
International Search Report and Written Opinion dated Aug. 18, 2021 in Application No. PCT/US2021/029467.
KR Office Action dated Aug. 6, 2022 in Application No. KR10-2016-0030705 With English translation.
KR Office Action dated Feb. 22, 2022, in Application No. KR1020170126058 with English translation.
KR Office Action dated Jul. 30, 2024 in KR Application No. 10-2022-7003084 with English translation.
Yong, L., et al., "Study on the Process of Tungsten-Cobalt Alloy Electrodeposition," China Tungsten Industry, 2005, vol. 20(4), pp. 45-47.
Final Office Action dated Apr. 5, 2017 issued in U.S. Appl. No. 14/020,339.
International Preliminary Report on Patentability dated Jan. 6, 2022 in PCT Application No. PCT/US2020/039150.
International Search Report and Written Opinion dated Oct. 7, 2020 issued in Application No. PCT/US2020/039150.
KR Office Action dated Jun. 10, 2022 in Application No. KR1020220062189 with English translation.
Notice of Allowance dated Apr. 2, 2021 issued in U.S. Appl. No. 16/410,420.
Notice of Allowance dated Feb. 12, 2019 issued in U.S. Appl. No. 15/343,089.
Notice of Allowance dated Jun. 21, 2017 issued in U.S. Appl. No. 14/663,279.
Office Action dated Jun. 26, 2018 issued in U.S. Appl. No. 15/343,089.
Office Action dated May 6, 2015 issued in U.S. Appl. No. 14/020,339.
Taiwanese First Office Action dated May 23, 2019 issued in Application No. TW 105106607.
Taiwanese Second Office Action dated Nov. 13, 2019 issued in Application No. TW 105106607.
Taiwanese Third Office Action dated Feb. 27, 2020 issued in Application No. TW 105106607.
Liu J., et al., "Acetylenic Polymers: Syntheses, Structures, and Functions," Chem. Rev, 2009, vol. 109(11), pp. 5799-5867.
Noia B., et al., "Test-wrapper optimization for embedded cores in TSV-based three-dimensional SOCs," IEEE International Conference on Computer Design, 2009, pp. 70-77.
Shi X Q., et al., "Development of CMOS-process-compatible interconnect technology for 3D-stacking of NAND flash memory chips," Proceedings 60th Electronic Components and Technology Conference, 2010, pp. 74-78.
Tsyntsaru N., et al., "Co-W nanocrystalline electrodeposits as barrier for interconnects," J Solid State Electrochem, 2014, vol. 18, pp. 3057-3064.
U.S. Non-Final Office Action dated Jan. 6, 2025 in U.S. Appl. No. 17/998,067.

(56) References Cited

OTHER PUBLICATIONS

U.S. Restriction requirement dated Oct. 24, 2024 in U.S. Appl. No. 17/998,067.

* cited by examiner 3 g/L Co
0 g/L W 3 g/L Co
0.2 g/L W

ELECTRODEPOSITION OF COBALT TUNGSTEN FILMS

INCORPORATION BY REFERENCE

A PCT Request Form is filed concurrently with this specification as part of the present application. Each application that the present application claims benefit of or priority to as identified in the concurrently filed PCT Request Form is incorporated by reference herein in its entirety and for all purposes.

BACKGROUND

Electroplating has long been used in the semiconductor industry to deposit metal on substrates. One metal commonly deposited through electroplating is copper, and specific electrolytes and plating methods have been developed to optimize copper deposition on substrates. In damascene processing, electroplating is often used to fill recessed features with metals to fabricate interconnects and other structures. Though copper is traditionally used in damascene processing to fill recessed features, other metals such as cobalt may be used to fill recessed features rather than copper. However, the electrolytes and plating methods used to electroplate copper may not be optimal for electroplating other metals.

The background provided herein is for the purposes of generally presenting the context of the disclosure. Work of the presently named inventors, to the extent that it is described in this background, as well as aspects of the description that may not otherwise qualify as prior art at the time of filing, are neither expressly nor impliedly admitted as prior art against the present disclosure.

SUMMARY

Provided herein is a method of electroplating a tungsten-containing metal film on a semiconductor substrate. The method includes providing a semiconductor substrate to an electroplating apparatus, where the semiconductor substrate has at least one recessed feature and comprises an exposed conductive seed layer at least on sidewalls of the at least one recessed feature. The method further includes contacting the semiconductor substrate with an electroplating solution in the electroplating apparatus, and catholically biasing the semiconductor substrate in the electroplating apparatus to electroplate a tungsten-containing metal film and electrochemically fill the at least one recessed feature with the tungsten-containing metal film. The tungsten-containing metal film comprises a metal selected from a group consisting of cobalt, nickel, and combinations thereof, wherein a tungsten content in the tungsten-containing metal film is between about 1-20 atomic %.

In some implementations, the tungsten-containing metal film is a cobalt tungsten (CoW) film. In some implementations, the conductive seed layer is a cobalt seed layer. In some implementations, the method further includes annealing the electroplated tungsten-containing metal film. In some implementations, the electroplating solution has a pH of between about 2-4. In some implementations, the electroplating solution has tungsten content equal to or less than about 4 and cathodically biasing the semiconductor substrate to electroplate a tungsten-containing metal film comprises electroplating at a current density equal to or less than about 12 mA/cm$^2$. In some implementations, the electroplating solution has tungsten content of equal to or less than about 2 g/L, and wherein cathodically biasing the semiconductor substrate to electroplate a tungsten-containing metal film comprises electroplating at a current density equal to or less than about 8 mA/cm$^2$. In some implementations, the tungsten-containing metal film is substantially free of oxide.

Another aspect involves an aqueous electroplating solution for electroplating a tungsten-containing metal film. The aqueous electroplating solution comprises a source of tungsten, where the source of tungsten comprises tungsten-oxygen bonds, and where concentration of tungsten in the aqueous electroplating solution is equal to or less than about 4 g/L. The aqueous electroplating solution further comprises a source of a metal in addition to the source of tungsten, wherein the metal is selected from a group consisting of cobalt, nickel, and combinations thereof, and an acid, where the aqueous electroplating solution has a pH of less than about 6.

In some implementations, the metal is cobalt. In some implementations, the concentration of tungsten in the aqueous electroplating solution is equal to or less than about 2 g/L. In some implementations, the aqueous electroplating solution further comprises a suppressor.

Another aspect involves an apparatus for electroplating tungsten-containing metal film on a semiconductor substrate. The apparatus comprises an electroplating chamber configured to hold an electroplating solution, a substrate holder configured to hold the semiconductor substrate in the electroplating solution, a power supply, and a controller configured with program instructions for performing the following operations: contacting a semiconductor substrate with an electroplating solution, where the semiconductor substrate has a plurality of recessed features, and where the electroplating solution comprises a source of tungsten and a source of a metal selected from a group consisting of cobalt, nickel, and combinations thereof, and cathodically biasing the semiconductor substrate to electroplate the tungsten-containing metal film and electrochemically fill the plurality of recessed features with the tungsten-containing metal film, where a tungsten content in the tungsten-containing metal film is between about 1-20 atomic %.

In some implementations, the program instructions for performing cathodically biasing the semiconductor substrate to electroplate the tungsten-containing metal film comprise program instructions for providing a current density of between about 0.25-12 mA/cm$^2$. In some implementations, the tungsten-containing metal film is a cobalt tungsten (CoW) film.

DETAILED DESCRIPTION

Figure 1A:
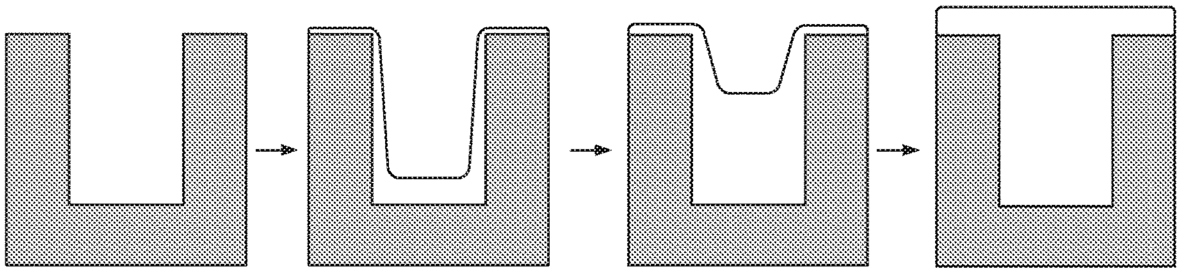
FIG. 1A shows a schematic illustration of an example bottom-up fill mechanism.

In the present disclosure, the terms "semiconductor wafer," "wafer," "substrate," "wafer substrate," "semiconductor substrate," and "partially fabricated integrated circuit" are used interchangeably. One of ordinary skill in the art would understand that the term "partially fabricated integrated circuit" can refer to a silicon wafer during any of many stages of integrated circuit fabrication. A wafer or substrate used in the semiconductor device industry typically has a diameter of 200 mm, or 300 mm, or 450 mm. The following detailed description assumes the present disclosure is implemented on a wafer. However, the present disclosure is not so limited. The work piece may be of various shapes, sizes, and materials. In addition to semiconductor wafers, other work pieces that may take advantage of the present disclosure include various articles such as printed circuit boards and the like.

Introduction

Electrodeposition of metal films has been performed for a variety of metals including but not limited to copper, cobalt, silver, tin, zinc, gold, nickel, palladium, and platinum. Electroplating has long been used in the semiconductor industry to deposit metal on substrates. One metal commonly deposited through electroplating is copper, and specific electrolytes and plating methods have been developed to optimize copper deposition on substrates. In damascene processing, electroplating is often used to fill recessed features with metals to fabricate interconnects and other structures. Though copper is traditionally used in damascene processing to fill recessed features, other metals such as cobalt may be used to fill recessed features rather than copper. However, the electrolytes and plating methods used to electroplate copper may not be optimal for electroplating other metals.

Electrolytes and plating methods have been developed to electroplate cobalt. A plating bath for electroplating cobalt may include inorganic materials such as cobalt sulfate, cobalt chloride, hydrochloric acid, sulfuric acid, and boric acid. In addition, the plating bath may further include organic additives such as accelerators, suppressors, levelers, brightening agents, wetting agents, surfactants, or combinations thereof. An example electrolyte and plating method for electroplating cobalt is described in U.S. patent application Ser. No. 14/663.279 to Doubina et al., titled "CHEMISTRY ADDITIVES AND PROCESS FOR COBALT FILM ELECTRODEPOSITION," and filed Mar. 19, 2015, which is incorporated by reference in its entirety and for all purposes.

Traditional middle-of-the-line (MOL) fabrication uses a stack having a barrier and/or liner layer, a tungsten nucleation layer, and a tungsten fill layer. The barrier layer may include titanium (Ti) or titanium nitride (TiN). A tungsten nucleation layer may be deposited on the barrier layer by chemical vapor deposition (CVD), atomic layer deposition (ALD), or pulsed nucleation layer (PNL) methods. Both the tungsten nucleation layer and the barrier layer are highly resistive compared to the tungsten fill layer. The tungsten fill layer may be deposited on the tungsten nucleation layer by CVD, plasma-enhanced CVD (PECVD), or physical vapor deposition (PVD). Tungsten (W) is frequently used in low resistivity electrical connections in the form of horizontal interconnects, vias between adjacent metal layers, and contacts between a first metal layer and devices on a semiconductor substrate. Tungsten films may be advantageous for its low resistivity, robust chemical stability, and high melting point.

As the geometries of electronic devices continue to shrink and the densities of devices continue to increase, overall feature size has decreased and aspect ratio has increased. Device nodes may be about 14 nm or less, 10 nm or less, or 7 nm or less. There are various challenges in tungsten fill as devices scale to smaller technology nodes. One challenge is preventing an increase in resistance due to thinner films in contacts and vias. As features become smaller, the tungsten contact or line resistance increases due to the scattering effect in thinner tungsten films. Low resistivity tungsten films are desirable for minimizing power losses and overheating in integrated circuit designs.

Typically, tungsten films are deposited in tungsten fill applications using CVD. Electrodeposition processes such as electroplating can be considered as an alternative to CVD. However, electrodeposition of tungsten films presents many challenges, among which include the difficulty or the lack of feasibility of electrochemical reduction of pure tungsten and the undesirable formation of tungsten oxides. Tungsten oxides increase the resistivity of tungsten films. Because of challenges in reducing tungsten oxides in electrodeposition processes, CVD of tungsten is generally considered more practical than electrodeposition of tungsten.

The present disclosure relates to electrodeposition of a tungsten-containing metal film. The tungsten-containing metal film may be electroplated with limited formation of tungsten oxides. The tungsten-containing metal film may include an additional metal such as cobalt, nickel, or combinations thereof, thereby forming cobalt tungsten (CoW), nickel tungsten (NiW), or cobalt nickel tungsten (CoNiW). Cobalt tungsten, nickel tungsten, or cobalt nickel tungsten may offer advantages over tungsten in some aspects of integrated circuit fabrication, such as reduced resistivity and improved electromigration. Furthermore, cobalt tungsten, nickel tungsten, or cobalt nickel tungsten may offer advantages over cobalt in some aspects of integrated circuit fabrication, such as increased resistance, higher temperature thresholds for large metal grain growth, higher melting temperature, and improved resistance to corrosion. Electroplating conditions such as pH, tungsten content, and/or current density may be controlled to facilitate electrodeposition of the tungsten-containing metal film.

Bottom-Up Fill

Figure 1B:
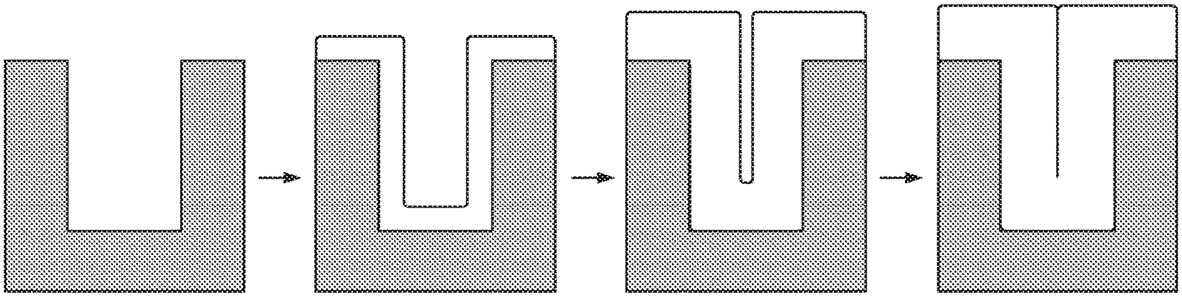
FIG. 1B shows a schematic illustration of an example conformal fill mechanism.

Electrodeposition is commonly used to fill recessed features with copper, cobalt, or other metals to fabricate interconnects and other structures. In order to form high quality interconnects, it is important to establish void-free, seam-free fill. In traditional damascene processing, organic additives such as suppressor, accelerator, and leveler are used to establish a bottom-up fill mechanism where the feature is filled from the bottom upwards. FIG. 1A shows a schematic illustration of an example bottom-up fill mechanism. Where a conformal fill mechanism is used, the electrodeposited film is formed at a substantially uniform thickness at all regions of the recessed feature. As the film builds up on the sidewalls of the feature, the sidewalls close in toward one another, forming a seam up the middle of the feature. FIG. 1B shows a schematic illustration of an example conformal fill mechanism.

In a bottom-up fill mechanism, illustrated in FIG. 1A, a recessed feature on a plating surface tends to be plated with metal from the bottom to the top of the feature, and to a lesser degree, inward from the sidewalk towards the center of the feature. It is important to control the deposition rate within the feature and in a field region in order to achieve uniform filling and avoid incorporating voids into the features. In conventional applications, one or more organic additives may be necessary in accomplishing bottom-up fill, each working to selectively increase or decrease the polarization at particular regions on the substrate surface. Organic additives may be important in achieving a desired metallurgy, film uniformity, defect control, and fill performance. Typically, an electroplating solution includes organic bath additives to permit controlled high quality electrofill of recessed features. Such additives typically include a suppressor, and possibly an accelerator and possibly a leveler. One role of the suppressor is to suppress electroplating and increase the surface polarization of the plating substrate. As used herein, many additive concentrations are recited in parts per million (ppm). This unit is equivalent to mg/L for the purpose of determining additive concentration in solution.

Without being limited by any theory, copper bottom-up fill may be understood in the following description. After the substrate is immersed in the electrolyte, the suppressor adsorbs onto the surface of the substrate, especially in exposed regions such as the field region. At the initial plating stage, there is a substantial differential in suppressor concentration between top and bottom of a recessed feature. This differential is present due to the relatively large size of the suppressor molecule and its correspondingly slow transport properties. Over this same initial plating time, it is believed that the accelerator accumulates at a low, substantially uniform concentration over the plating surface, including the bottom and sidewalls of the recessed feature. Because the accelerator diffuses into features more rapidly than the suppressor, the initial ratio of accelerator:suppressor within the feature (especially at the feature bottom) is relatively high. The relatively high initial accelerator:suppressor ratio within the feature promotes rapid plating from the bottom of the feature upwards and from the sidewalk inwards. Meanwhile, the initial plating rate in the field region is relatively low due to the lower ratio of accelerator: suppressor. Thus, in the initial plating stages, plating occurs relatively faster within the feature and relatively slower in the field region. As plating continues, the feature fills with metal and the surface area within the feature is reduced. Because of the decreasing surface area and the accelerator substantially remaining on the surface, the local surface concentration of accelerator within the feature increases as plating continues. This increased accelerator concentration within the feature helps maintain the differential plating rate that is beneficial for bottom-up fill.

The mechanism for bottom-up fill of copper versus the bottom-up fill of cobalt may be different. Without being limited by any theory, cobalt bottom-up fill may be understood in the following description. Low current is applied to the substrate when the substrate is immersed in the electrolyte. Upon immersion, the relative concentrations of all solution species are initially equal in the field region and in the recessed feature. The potential for cobalt deposition depends on the pH and suppressor concentration. A suppressor is known to affect deposition kinetics with a significant impact on current efficiency. Altering pH ordinarily does not affect the kinetics of metal deposition, but pH can modify the deposition rate of cobalt. Suppressor gradients and pH gradients begin to develop when the low current is applied. This can be due in part to mass transport of species to the bottom of a recessed feature being significantly less than the field region, the low current efficiency for deposition, and slow diffusion rate of suppressor. As a result, suppressor concentration may be high in the field region and along upper sidewalls of the recessed feature, where the suppressor minimizes cobalt deposition in the field region. Hydrogen ion ($H^+$) concentration may also be high in the field region but low towards the bottom of the recessed feature. Application of the low current reduces the hydrogen ion to hydrogen gas. This leaves very little current in the field region for cobalt plating ($Co^{2+}+2e^- \rightarrow Co$) due to the competing reaction of electrons with hydrogen ion. $H^+$ concentration towards the bottom of the recessed feature is less than in the field region, and suppressor concentration towards the bottom of the recessed feature is less than in the field region. Current efficiency is significantly higher towards the bottom of the recessed feature than the field region. This allows cobalt reduction to start occurring and cobalt bottom-up filling takes place. With limited $H^+$ around due to consumption at the bottom of the feature by cobalt plating, cobalt plates at a faster rate at the bottom of the feature than around the field region.

To date, bottom-up fill methods have largely been optimized in the context of depositing copper in recessed features. As such, the electrolytes/additive packages are typically optimized for high quality copper plating. When such electrolytes/additives are used to deposit cobalt tungsten, nickel tungsten, or cobalt nickel tungsten, the bottom-up fill behavior may be compromised and the fill may proceed from the sidewalk inward rather than from the bottom upward. Disclosed herein are particular additives that may be useful in promoting bottom-up fill in the context of electroplating cobalt tungsten, nickel tungsten, or cobalt nickel tungsten. The bottom-up fill mechanism for cobalt tungsten, nickel tungsten, or cobalt nickel tungsten may be similar to the bottom-up fill mechanism for cobalt.

Suppressors

While not wishing to be bound to any theory or mechanism of action, it is believed that suppressors (either alone or in combination with other bath additives) are surface-kinetic polarizing compounds that lead to a significant increase in the voltage drop across the substrate-electrolyte interface, especially when present in combination with a surface chemisorbing halide (e.g., chloride or bromide). The halide may act as a chemisorbed-bridge between the suppressor molecules and the wafer surface. The suppressor both (1) increases the local polarization of the substrate surface at regions where the suppressor is present relative to regions where the suppressor is absent, and (2) increases the polarization of the substrate surface generally. The increased polarization (local and/or general) corresponds to increased resistivity/impedance and therefore slower plating at a particular applied potential.

It is believed that suppressors are not significantly incorporated into the deposited film, though they may slowly degrade over time by electrolysis or chemical decomposition in the bath. Suppressors are often relatively large molecules, and in many instances they are polymeric in nature. Some suppressors include polyethylene and polypropylene oxides with S- and/or N-containing functional groups, block polymers of polyethylene oxide and polypropylene oxides, etc. Particular examples of suppressors that may be useful in various implementations include but are not limited to: carboxymethylcellulose; nonylphenolpolyglycol ether; polyethylene glycoldimethyl ether; octandiolbis(polyalkylene glycol ether); octanol polyalkylene glycol ether; oleic acid polyglycol ester; polyethylene propylene glycol; polyethylene glycol; polyethyleneimine; polyethylene glycoldimethyl ether; polyoxypropylene glycol; polypropylene glycol; polyvinyl alcohol; stearic acid polyglycol ester; stearyl alcohol polyglycol ether; polyethylene oxide; ethylene oxide-propylene oxide copolymers; butyl alcohol-ethylene oxide-propylene oxide copolymers; 2-Mercapto-5-benzimidazolesulfonic acid; 2-mercaptobenzitnidazole (MBI); and benzotriazole. Combinations of these suppressors may also be used.

In some implementations, the suppressor includes one or more nitrogen atoms such as an amine group or an imine group. In some implementations, the suppressor is a polymeric or oligomeric compound containing amine groups separated by a carbon aliphatic spacer such as $CH_2CH_2$ or $CH_2CH_2CH_2$. In a particular implementation, the suppressor is polyethyleneimine (PEI, also known as polyaziridine, poly[imino(1,2-ethanediyl)], or poly(iminoethylene)). PEI has shown very good bottom-up fill characteristics in the context of cobalt deposition. PEI may have very good bottom-up fill characteristics in the context of cobalt tungsten deposition. The other identified suppressors may also be particularly useful in the context of cobalt deposition or cobalt tungsten deposition.

The suppressor chosen may be a relatively strong suppressor. Stronger suppressors (which exhibit stronger polarization) have been shown to produce better bottom-up fill results in the context of cobalt deposition. The suppressor chosen may be a stronger suppressor than polyethylene glycol (PEG). In some cases the suppressor chosen may be at least as strong of a suppressor as PEI.

The suppressors can have linear chain structures, branch structures, or both. It is common that suppressor molecules with various molecular weights co-exist in a commercial suppressor solution. Due in part to suppressors' large size, the diffusion of these compounds into a recessed feature can be relatively slow compared to other bath components. In some implementations, the average molecular weight of the suppressor, which as mentioned may be a polymeric amine-containing material, may be between about 200-600 g/mol, or between about 300-1000 g/mol, or between about 500-1500 g/mol. By contrast, the suppressor polyethylene glycol (PEG) is commonly provided at a molecular weight between about 1,500-10,000 g/mol when used to electroplate copper.

The suppressor may be provided in the electrolyte at a concentration between about 1-10,000 ppm, for example between about 10-60 ppm, or between about 15-60 ppm, or between about 30-60 ppm. In this context, parts per million (ppm) is a mass fraction of the suppressor molecules in the electrolyte. In some cases, the suppressor may have a concentration of at least about 10 ppm, or at least about 15 ppm, or at least about 20 ppm, or at least about 30 ppm, or at least about 50 ppm. In these or other cases, the suppressor may have a concentration of about 1,000 ppm or less, for example about 500 ppm or less, about 100 ppm or less, about 75 ppm or less, about 60 ppm or less, or about 50 ppm or less. Different suppressors may have different optimal concentrations. In some implementations, the suppressor is PEI and is present in electrolyte at a concentration that meets one or more of the limitations set out in this paragraph.

Accelerators

While not wishing to be bound by any theory or mechanism of action, it is believed that accelerators (either alone or in combination with other bath additives) tend to locally reduce the polarization effect associated with the presence of suppressors, and thereby locally increase the electrodeposition rate. The reduced polarization effect is most pronounced in regions where the adsorbed accelerator is most concentrated (i.e., the polarization is reduced as a function of the local surface concentration of adsorbed accelerator).

Although the accelerator may become strongly adsorbed to the substrate surface and generally laterally-surface immobile as a result of the plating reactions, the accelerator is generally not significantly incorporated into the film. Thus, the accelerator remains on the surface as metal is deposited. As a recess is filled, the local accelerator concentration increases on the surface within the recess. Accelerators tend to be smaller molecules and exhibit faster diffusion into recessed features, as compared to suppressors.

Example accelerators include but are not limited to: N,N-dimethyl-dithiocarbamic acid (-3-sulfopropyl)ester; 3-mercapto-propylsulfonic acid-(3-sulfurpropyl) ester; 3-sulfanyl-1-propane sulfonate; carbonic acid-dithio-o-ethylester-s-ester with 3-mercapto-1-propane sulfonic acid potassium salt; bis-sulfopropyl disulfide; 3-(benzothi azolyl-s-thio)propyl sulfonic acid sodium salt; pyridinium propyl sulfobetaine; 1-sodium-3-mercaptopropane-1-sulfonate; N,N-dimethyl-dithiocarbamic acid-(3-sulfopropyl)ester; 3-mercapto-ethyl propylsulfonic acid (3-sulfoethyl)ester; 3-mercapto-ethylsulfonic acid sodium salt; carbonic acid-dithio-o-ethyl ester-s-ester; pyridinium ethyl sulfobetaine; and thiourea. In some cases a combination of these accelerators is used. In a particular implementation, the accelerator is 3-sulfanyl-1-propane sulfonate (commonly referred to as MPS or 3-mercapto-1-propane sulfonic acid sodium salt) and/or thiourea (TU). The accelerator chosen may include, in some cases, a sulfonic acid component and/or an ester component and/or a thiol group. In another particular implementation, there is no accelerator present in the electrolyte.

Levelers

While not wishing to be bound by any theory or mechanism of action, it is believed that levelers (either alone or in combination with other bath additives) act as suppressing agents, in some cases to counteract the depolarization effect associated with accelerators, especially in exposed portions of a substrate, such as the field region of a wafer being processed, and at the sidewalls of a feature. The leveler may locally increase the polarization/surface resistance of the substrate, thereby slowing the local electrodeposition reaction in regions where the leveler is present. The local concentration of levelers is determined to some degree by mass transport. Therefore levelers act principally on surface structures having geometries that protrude away from the surface. This action "smooths" the surface of the electrodeposited layer. It is believed that in many cases the leveler reacts or is consumed at the substrate surface at a rate that is at or near a diffusion limited rate, and therefore, a continuous supply of leveler is often beneficial in maintaining uniform plating conditions over time.

Leveler compounds are generally classified as levelers based on their electrochemical function and impact and do not require specific chemical structure or formulation. However, levelers often contain one or more nitrogen, amine, imide or imidazole, and may also contain sulfur functional groups. Certain levelers include one or more five and six member rings and/or conjugated organic compound derivatives. Nitrogen groups may form part of the ring structure. In amine-containing levelers, the amines may be primary, secondary or tertiary alkyl amines. Furthermore, the amine may be an aryl amine or a heterocyclic amine. Example amines include, but are not limited to, dialkylamines, trialkylamines, arylalkylamines, triazoles, imidazole, triazole, tetrazole, benzimidazole, benzotriazole, piperidine, morpholines, piperazine, pyridine, oxazole, benzoxazole, pyrimidine, quonoline, and isoquinoline. Imidazole and pyridine may be useful in some cases. Other examples of levelers include Janus Green B and Prussian Blue. Leveler compounds may also include ethoxide groups. For example, the leveler may include a general backbone similar to that found in polyethylene glycol or polyethylene oxide, with fragments of amine functionally inserted over the chain (e.g., Janus Green B). Example epoxides include, but are not limited to, epihalohydrins such as epichlorohydrin and epibromohydrin, and polyepoxide compounds. Polyepoxide compounds having two or more epoxide moieties joined together by an ether-containing linkage may be useful in some cases. Some leveler compounds are polymeric, while others are not. Example polymeric leveler compounds include, but are not limited to, polyethylenimine, polyamidoamines, and reaction products of an amine with various oxygen epoxides or sulfides. One example of a non-polymeric leveler is 6-mercapto-hexanol. Another example leveler is polyvinylpyrrolidone (PVP).

Example levelers may include but are not limited to: alkylated polyalkyleneimines; polyethylene glycol; organic sulfonates; 4-mercaptopyridine; 2-mercaptothiazoline; ethylene thiourea; thiourea; 1-(2-hydroxyethyl)2-imidazolidinethion; sodium naphthalene 2-sulphonate; acrylamide; substituted amines; imidazole; triazole; tetrazole; piperidine; morpholine; piperazine; pyridine; oxazole; benzoxazole; quinolin; isoquinoline; coumarin; butyne 1:4 diol and derivatives thereof. Combinations of these levelers may also be used in some cases. In some implementations, there is no leveler present in the electrolyte.

Wetting Agents

Wetting agents, sometimes referred to as surfactants, can be added to the electrolyte to enhance the wetting behavior on the substrate and thereby prevent pitting. Suitable wetting agents in the context of cobalt tungsten deposition include, but are not limited to: alkyl phenoxy polyethoxyethanols; compounds of polyoxyethylene and polyethyleneglycol polymers; and block and random copolymers of polyoxyethylene and polyoxypropylene. In certain embodiments, the wetting agent may be present at a concentration between about 1-10,000 ppm, for example between about 100-1000 ppm. In some implementations, the concentration of leveler is at least about 1 ppm, or at least about 100 ppm. In these or other implementations, the concentration of leveler may be about 5000 ppm or less, for example about 1000 ppm or less.

Brightening Agents

Brightening agents may also be added to the electrolyte to achieve a high plating rate and a high quality smooth/bright film having optimal luster. Suitable brightening agents in the context of cobalt tungsten deposition include, but are not limited to: 3-sulfanyl-1-propane sulfonate (MPS, also referred to as 3-mercapto-1-propane sulfonic acid sodium salt); 2-mercapto-ethane sulfonic acid sodium salt; bisulfopropyl disulfide; N,N-dimethyldithiocarbamic acid ester sodium salt; (o-ethyldithiocarbonato)-S-(3-sulfurpropyl)-ester potassium salt; 3-[(amino-iminomethyl)-thio]-1-propane sulfonic acid sodium salt; phenolphthalein; lactone; lactams; cyclic sulfate esters; cyclic imides; cyclic oxazolinones; assymetrical alkyne sulfonic acids; (N-substituted pyridyl)-alkyl sulfonic acid betaines; amino polyarylmethanes; pyridine derivatives; quinoline derivatives; and sulfonated aryl aldehydes. In certain implementations, a brightening agent may be present in electrolyte at a concentration between about 1 ppb and 1 g/L, or between about 10 ppb-100 ppm. In some implementations, the brightening agent is present at a concentration of at least about 1 ppb, for example at least about 10 ppb. In these or other cases, the brightening agent may have a concentration of about 100 ppm or less, for example about 10 ppm or less.

Feature Fill With Tungsten-Containing Metal Film

Substrates may include a plurality of features. "Features" as used herein may refer to non-planar structures of a substrate, typically a surface being modified in a semiconductor device fabrication operation, Examples of features, which may also be referred to as "negative features" or "recessed features," include trenches, holes, contact holes, vias, gaps, recessed regions, and the like. These terms may be used interchangeably in the present disclosure. One example of a feature is a hole or via in a semiconductor substrate or in a layer on the substrate. Another example is a trench in a substrate or layer. A feature typically has an aspect ratio (depth to lateral dimension). A feature may be characterized by one or more of narrow and/or re-entrant openings, constrictions within the feature, and high aspect ratios.

Recessed features in the present disclosure may have a small lateral dimension (e.g., width) and a high aspect ratio. In some implementations, a diameter or width of the recessed feature is equal to or less than about 100 nm, equal to or less than about 50 nm, equal to or less than about 40 nm, equal to or less than about 30 nm, equal to or less than about 20 nm, or equal to or less than about 10 nm. For example, the recessed feature may have a diameter or width between about 5-100 nm or between about 10-50 nm. In these or other cases, the recessed features may have a depth equal to or greater than about 20 nm, equal to or greater than about 30 nm, or equal to or greater than about 50 nm. For example, the recessed feature may have a depth between about 30-200 nm or between about 50-400 nm. The aspect ratio of the recessed feature can be measured as the depth of the feature divided by the width of the feature near its opening. In some implementations, the recessed feature has an aspect ratio of at least about 4:1, at least about 6:1, at least about 10:1, at least about 15:1, at least about 20:1, at least about 25:1, or higher.

In various implementations, the feature may have an under-layer, such as a barrier layer or adhesion layer. Non-limiting examples of under-layers include dielectric layers and conducting layers, e.g., silicon oxides, silicon nitrides, silicon carbides, metal oxides, metal nitrides, metal carbides, and metal layers. In certain implementations, the under-layer may be titanium nitride (TiN), titanium (Ti), tantalum nitride (TaN), tantalum (Ta), tungsten nitride (WN), titanium aluminide (TiAl), or titanium oxide ($TiO_x$).

Features of a substrate can be of various types. In some implementations, a feature can have straight sidewalls, positively sloped sidewalls, or negatively sloped sidewalls. In some embodiments, a feature can have sidewall topography or sidewall roughness, which may occur as a result of an etch process to form the feature. In some implementations, a feature can have a feature opening that is greater at the top of the feature than at the bottom, or a feature can have a feature opening that is greater at the bottom of the feature than at the top. In some implementations, a feature can be partially filled with material or have one or more under-layers. Gapfill of features such as any of foregoing implementations can depend on feature type and profile.

As the aspect ratio of recessed features increases, mass transport limitations of CVD gas phase reactions may cause "bread-loafing" deposition effects that show thicker deposition at top surfaces and thinner deposition at recessed surfaces, which causes the top of a feature opening to close before the feature can be completely filled. Accordingly, CVD of tungsten in a recessed feature may have its limitations in high aspect ratio features. In addition, tungsten deposited by CVD may have its limitations in terms of resistivity compared to other metals.

Electrodeposition of a tungsten-containing metal film in recessed features of a substrate may be achieved by incorporation of one or both of cobalt and nickel under appropriate electrodeposition conditions. Without being limited by any theory, the incorporation of one or both of cobalt and nickel may effectively facilitate reduction of tungsten ions to tungsten metal and suppress formation of tungsten oxide. However, the concentration ratio of tungsten to cobalt and/or nickel in the electrolyte may be controlled to limit formation of tungsten oxide, among other electrodeposition conditions.

Figure 2:
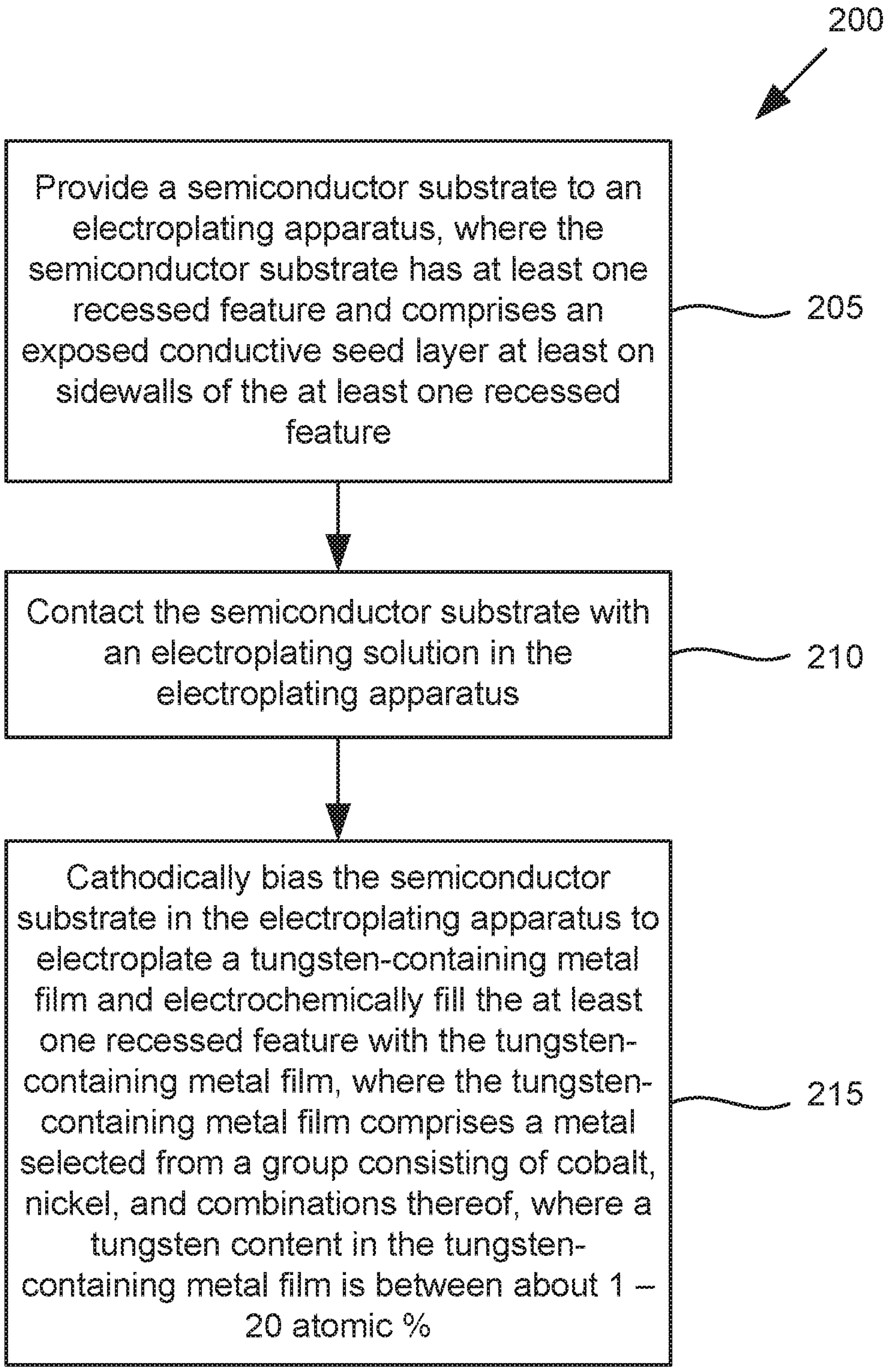
FIG. 2 shows a flow diagram of an example process for electroplating a tungsten-containing metal film in recessed features of a semiconductor substrate according to some implementations.

FIG. 2 shows a flow diagram of an example process for electroplating a tungsten-containing metal film in recessed features of a semiconductor substrate according to some implementations. Operations of a process 200 shown in FIG. 2 may include additional, fewer, or different operations. The operations of the process 200 shown in FIG. 2 may be performed by any one of the apparatuses described in FIGS. 11-13.

At block 205 of the process 200, a semiconductor substrate is provided to an electroplating apparatus. The semiconductor substrate has at least one recessed feature and comprises an exposed conductive seed layer at least on sidewalls of the at least one recessed feature. In some implementations, the at least one recessed feature has a small lateral dimension, where the width of the at least one recessed feature is equal to or less than about 40 nm, or equal to or less than about 20 nm. In some implementations, the at least one recessed feature has a high aspect ratio, where the depth to width aspect ratio is at least about 5:1, at least about 10:1, or at least about 20:1. The at least one recessed feature may be formed through one or more layers in the semiconductor substrate, such as one or more dielectric layers. In some implementations, the at least one recessed feature may serve as a via or contact hole in middle-of-the-line (MOL) semiconductor fabrication processes. In some MOL semiconductor fabrication processes, one or more contact holes may be patterned over a finFET or transistor structure.

An exposed conductive seed layer may be deposited on at least sidewalls of the at least one recessed feature. In some implementations, the exposed conductive seed layer is deposited on at least sidewalls and bottom surfaces of the at least one recessed feature. In some implementations, the exposed conductive seed layer may be formed over a liner and/or barrier layer of the semiconductor substrate. The exposed conductive seed layer may be relatively thin. In some implementations, the exposed conductive seed layer has a thickness between about 10-100 Å, for example between about 15-30 Å, or between about 30-50 Å. In some implementations, the exposed conductive seed layer is a cobalt seed layer. The exposed conductive seed layer is often deposited by physical vapor deposition, atomic layer deposition, or chemical vapor deposition. In some implementations, the exposed conductive seed layer is pretreated to remove oxides or other impurities.

At block 210 of the process 200, the semiconductor substrate is contacted with an electroplating solution in the electroplating apparatus. As used herein, the electroplating solution may also be referred to as an electrolyte, plating solution, plating bath, or aqueous electroplating solution. The electroplating solution includes a source of tungsten and a source of a metal in addition to the source of tungsten, where the metal is selected from a group consisting of cobalt, nickel, and combinations thereof. In some implementations, the metal is cobalt.

In some implementations, the source of tungsten is a tungstate compound or tungsten salt that includes tungsten-oxygen bonds. For example, the source of tungsten includes but is not limited to: sodium tungstate dihydrate ($Na_2WO_4.2H_2O$), calcium tungstate ($CaWO_4$), potassium tungstate ($K_2WO_4$), borotungstates, phosphotungstates, fluorotungstates, other metal salt tungstates, or metal polytungstate salts. The tungsten salt is soluble in an aqueous plating bath. In some implementations, the source of the metal includes a source of cobalt, where the source of cobalt can be a cobalt salt such as cobalt chloride ($CoCl_2$) or cobalt sulfate ($CoSO_4$). In addition or in the alternative to the source of cobalt, a source of metal includes a source of nickel, where the source of nickel can be a nickel salt such as nickel chloride ($NiCl_2$) or nickel sulfate ($NiSO_4$).

The concentration of tungsten ions in the electroplating solution may be relatively small compared to compounds. It will be understood that usage of the terms "concentration of tungsten" and "concentration of tungsten ions" in aqueous solution may be used interchangeably. In some implementations, the concentration of tungsten in the electroplating solution is equal to or less than about 30 g/L, equal to or less than about 8 g/L, equal to or less than about 4 g/L, or equal to or less than about 2 g/L. For example, the concentration of tungsten in the electroplating solution may be between about 0.01-30 g/L, 0.05-8 g/L, or between about 0.1 g/L-4 g/L. In some implementations, the source of tungsten comprises tungsten-oxygen bonds, and the concentration of tungsten in the electroplating solution is equal to or less than about 4 g/L.

Cobalt ions from a cobalt salt and/or nickel ions from a nickel salt may be added to the electroplating solution. It will be understood that usage of the terms "concentration of cobalt" and "concentration of cobalt ions" in aqueous solution may be used interchangeably. In some implementations, the concentration of cobalt in the electroplating solution is equal to or less than about 30 g/L, equal to or less than about 20 g/L, equal to or less than about 10 g/L, or equal to or less than about 5 g/L. For example, the concentration of cobalt in the electroplating solution is between about 0.5-30 g/L, between about 1-2.0 g/L, or between about 2-10 g/L. In addition or in the alternative, the concentration of nickel in the electroplating solution is equal to or less than about 30 g/L, equal to or less than about 20 g/L, equal to or less than about 10 g/L, or equal to or less than about 5 g/L. For example, the concentration of nickel ions is between about 0.5-30 g/L, between about 1-20 g/L, or between about 2-10 g/L.

The pH of the electroplating solution can be controlled to promote electrodeposition of the tungsten-containing metal film. The electroplating solution may be acidic or at least slightly acidic. Without being limited by any theory, the acidic nature of the electroplating solution may help promote oxide dissolution so that oxides are generally not present on the surface of the semiconductor substrate. In some implementations, the electroplating solution includes an acid, where the pH is less than about 6, between about 0.5-6, between about 1-6, between about 2-6, or between about 2-4.

In some implementations, the electroplating solution includes an acid such as boric acid. Without being limited by any theory, the presence of boric acid may help prevent the deposition of hydroxides (e.g., cobalt hydroxides). The conductivity of the electroplating solution is generally not affected by the concentration of boric acid. In other words, the conductivity of the electroplating solution at 0 g/L of boric acid is essentially the same as that at 30 g/L of boric acid. The boric acid may interact with water molecules to form tetrahydroxyborate, which produces a slight acidity in aqueous solution. In some implementations, the concentration of boric acid in the electroplating solution is between about 0-40 g/L, between about 1-35 g/L, between about 2-30 g/L, or between about 5-25 g/L. The concentration of the acid reflects the concentration of the entire acid molecule, not the mass of hydrogen cations alone.

Other acids may also be present in the electroplating solution, including but not limited to sulfuric acid, methane sulfonic acid, and hydrochloric acid. The concentration of sulfuric acid may influence the conductivity of the electroplating solution. As the concentration of sulfuric acid increases, the conductivity of the electroplating solution increases. Lower conductivity electroplating solutions may assist in mitigating across-wafer uniformity issues caused by the terminal effect. In some implementations, hydrochloric acid may be present in the electroplating solution, which may provide chloride ions in solution.

The electroplating solution may include halide ions such as chloride anions, bromide anions, or combinations thereof. Halide ions may act as bridges to assist the adsorption of certain organic additives (e.g., suppressor). In some implementations, the concentration of halide ions may be between about 1-200 ppm, between about 2-150 ppm, or between about 5-100 ppm. It will be understood that in some implementations, halide ions are not present in the electroplating solution (i.e., about 0 ppm).

The electroplating solution may include one or more complexing agents. Complexing agents are additives that bind to cobalt ions and/or tungsten ions in solution, thereby increasing the degree of polarization on the electroplating surface. In some implementations, the concentration of complexing agents may be between about 0.1-30 g/L, between about 0.5-20 g/L, or between about 1-15 g/L. It will be understood that in some implementations, complexing agents are not present in the electroplating solution (i.e., about 0 g/L). Example complexing agents include but are not limited to ethylenediaminetetraacetic acid (EDTA), nitrilotriacetic acid (NTA), benzotriazole, crown ethers, and combinations thereof.

The electroplating solution may include one or more organic additives. The presence of organic additives may be important in achieving a desired metallurgy, film uniformity, defect control, and fill performance. As discussed earlier, organic additives may promote bottom-up filling. In some implementations, the electroplating solution includes a suppressor. In some implementations, the concentration of the one or more organic additives may be between about 1-500 ppm, between about 2-300 ppm, or between about 5-200 ppm, where the one or more organic additives may include at least a suppressor or at least a suppressor and a leveler. Other organic additives may include but are not limited to brightening agents, wetting agents, and surfactants.

Table 1 lists example formulations for electroplating solutions associated with electrodeposition of cobalt tungsten. Table 2 lists example formulations for electroplating solutions associated with electrodeposition of cobalt nickel tungsten.

TABLE 1

| Species | Concentration |
|---|---|
| Cobalt Salt | 0.5-30 g/L |
| Tungstate Compound | 0.01-30 g/L |
| Chloride, Bromide Ion | 0-200 ppm |
| Organic Additives | 0-500 ppm |
| Complexing Agent | 0-30 g/L |
| Boric Acid | 0-40 g/L |

TABLE 2

| Species | Concentration |
|---|---|
| Cobalt Salt | 0.5-30 g/L |
| Tungstate Compound | 0.01-30 g/L |
| Nickel Salt | 0.5-30 g/L |
| Chloride, Bromide Ion | 0-200 ppm |
| Organic Additives | 0-500 ppm |
| Complexing Agent | 0-30 g/L |
| Boric Acid | 0-40 g/L |

At block 215 of the process 200, the semiconductor substrate is cathodically biased in the electroplating apparatus to electroplate a tungsten-containing, metal film and electrochemically fill the at least one recessed feature with the tungsten-containing film. The tungsten-containing metal film comprises a metal selected from a group consisting of cobalt, nickel, and combinations thereof, where a tungsten content in the tungsten-containing metal film is between about 1-20 atomic %. The semiconductor substrate is cathodically biased to electroplate the tungsten-containing metal film while the semiconductor substrate is immersed in or contacting the electroplating solution. The conductive seed layer contacts the electroplating solution while the semiconductor substrate is cathodically biased so that metal ions are electrochemically reduced to form metal, thereby causing the tungsten-containing metal film to form on the conductive seed layer.

A waveform used to electroplate the tungsten-containing metal film can affect the bottom-up plating mechanism. Thus, waveform features may help promote high quality electroplating results, where the waveform features may help promote seam-free bottom-up fill of the tungsten-containing metal film. The manner in which current and/or voltage is applied to the semiconductor substrate during electroplating can influence the quality of electroplating. Current may be applied to the semiconductor substrate by a power supply such as a DC power supply. In some implementations, the current density may be equal to or less than about 12 $mA/cm^2$, equal to or less than about 8 $mA/cm^2$, or equal to or less than about 4 $mA/cm^2$. For example, the current density may be between about 0.25-12 $mA/cm^2$, between about 0.5-8 $mA/cm^2$, or between about 1-4 $mA/cm^2$. The current density when filling the at least one recessed feature may be less than the current density when depositing an overburden.

In some implementations, the waveform applied to the semiconductor substrate may be galvanostatically controlled. Galvanostatic control delivers constant current to the semiconductor substrate when the semiconductor substrate is immersed in the electroplating solution. In some implementations, the waveform applied to the semiconductor substrate may be gal vanodynamicall y controlled. Galvanodynamic control delivers current that ramps up or ramps down during electrofill. For example, current can ramp up or ramp down depending on whether electroplating is in its early stages or in its later stages. Potentiostatic control applies a constant potential to the semiconductor substrate when the semiconductor substrate is immersed in the electroplating solution. Potentiodynamic control provides potential that ramps up or ramps down during electrofill.

The electroplating apparatus may maintain the temperature of the electroplating solution at certain temperatures. In some implementations, a temperature of the electroplating solution is between about 15-90° C., between about 25-80° C., or between about 25-75° C.

The at least one recessed feature is electrochemically filled with the tungsten-containing metal film. As used herein, electrochemically "filled" refers to partially filled or completely filled states of the at least one recessed feature. Electrochemical reactions at the surface of the semiconductor substrate occur, thereby causing bulk electroplating of metal on the conductive seed layer, where the metal includes cobalt tungsten, nickel tungsten, or cobalt nickel tungsten. The at least one recessed feature may be electrochemically filled by a bottom-up fill mechanism, in some implementations, the at least one recessed feature is electrochemically filled by a seam-free bottom-up fill mechanism. An overburden may be subsequently deposited, where the overburden may include electroplated tungsten-containing metal film in a field region of the semiconductor substrate. In some implementations, the overburden is deposited at a higher current density. For example, the overburden may be deposited at a current density between about 3-15 $mA/cm^2$.

Various techniques are available for combating thickness variation during electroplating. This may arise due in part to the terminal effect, where plating may occur more rapidly around edges of the substrate than at the center of the substrate because of the relatively high resistance of the conductive seed layer (e.g., cobalt seed layer). Some techniques for addressing the terminal effect include but are not limited to using a dual cathode, a tertiary cathode, and/or a high resistance virtual anode (HRVA). The HRVA is sometimes referred to as a channeled ionically resistive plate (CIRP). In addition or in the alternative, a low conductivity electroplating solution may be used to combat thickness variation arising during electroplating. Lower conductivity can be correlated with lower concentrations of cobalt, tungsten, and/or nickel in the electroplating solution. Moreover, lower conductivity can be achieved with lower concentrations of acid/base components (e.g., sulfuric acid) in the electroplating solution.

Techniques for promoting uniform electroplating include techniques related to substrate-to-electrolyte entry processes. Substrate entry generally falls into three major categories: cold, hot, and potentiostatic. In cold entry, cathodic biasing of the semiconductor substrate and plating of the semiconductor substrate is delayed until substrate entry into the electrolyte is complete. In hot entry, cathodic biasing of the semiconductor substrate occurs prior to or during substrate entry into the electrolyte. Current density is typically greater at the beginning of entry and becomes smaller over time. In potentiostatic entry, the potential between the semiconductor substrate and a reference electrode carrying no current is maintained at a fixed value. Current may increase approximately linearly with increasing wetted area of the semiconductor substrate during potentiostatic entry. An appropriate substrate-to-electrolyte entry process may be selected for reducing the terminal effect.

The content of tungsten in the tungsten-containing metal film may be relatively limited, where the tungsten content in the tungsten-containing metal film is between about 1-20 atomic %. In some implementations, tungsten content in the tungsten-containing metal film is equal to or less than about 20 atomic %, equal to or less than about 15 atomic %, equal to or less than about 12 atomic %, or equal to or less than about 10 atomic %. For example, the tungsten content in the tungsten-containing metal film is between about 1-20 atomic %, between about 1-15 atomic %, between about 2-15 atomic between about 2-12 atomic %, or between about 3-12 atomic %.

In some implementations, the remaining balance of the tungsten-containing metal film may be the metal selected from the group consisting of cobalt, nickel, and combinations thereof. In other words, the tungsten-containing metal film is a cobalt tungsten alloy, nickel tungsten alloy, or a cobalt nickel tungsten alloy. The content of the metal in the tungsten-containing metal film may be substantially greater or at least greater than the tungsten content. For example, cobalt content in the tungsten-containing metal film may be between about 50-99 atomic %, between about 60-99 atomic %, between about 75-98 atomic %, between about 80-98 atomic %, or between about 85-98 atomic %. Accordingly, the content of the metal in the tungsten-containing metal film may be at least two times greater, at least three times greater, or at least four times greater than the tungsten content. Without being limited by any theory, excess tungsten content in the tungsten-containing metal film can undesirably lead to the formation of oxides during electroplating.

The tungsten-containing metal film may contain an acceptable amount of other elements such as hydrogen, oxygen, carbon, and other impurities. For example, other impurities may be between about 0.5-5 atomic % in the tungsten-containing metal film. Without being limited by any theory, the substantially greater atomic percentage of cobalt, nickel, or cobalt-nickel content in the tungsten-containing metal film may suppress the formation of tungsten oxide during electroplating. The tungsten-containing metal film may be substantially free of oxide. As used herein, "substantially free of oxide" can refer to values where a concentration of oxide in the tungsten-containing metal film is equal to or less than about 1 atomic %.

The resistivity of the tungsten-containing metal film may be less than pure tungsten. In some implementations, the sheet resistance of the tungsten-containing metal film may be equal to or less than about 100 micro-ohm/$cm^2$, equal to or less than about 75 micro-ohm/$cm^2$, or equal to or less than about 50 micro-ohm/$cm^2$.

Compared to pure cobalt, a tungsten-containing metal film such as cobalt tungsten may have higher temperature thresholds for large grain growth, higher melting temperature, higher resistivity, and higher resistance to corrosion.

Use cases may exist for electroplating cobalt tungsten as opposed to pure cobalt. Whereas electroplated cobalt may have relatively large grains after anneal, electroplated cobalt tungsten may have comparatively smaller grains after anneal. This is shown, for example, in data reflected in FIG. 9. In some implementations, an average grain size in the tungsten-containing metal film after anneal is between about 20-100 nm, between about 25-75 nm, or between about 30-50 nm.

In some implementations, the process 200 further includes annealing the electroplated tungsten-containing metal film. The electroplated tungsten-containing metal film may be subject to a post-electrofill annealing process. In some implementations, the electroplated tungsten-containing film may be annealed at a temperature greater than about 100° C., greater than about 200° C., or greater than about 300° C. for a period of time. Without being limited by any theory, the post-electrofill annealing process may grow and stabilize grain structures in the electroplated tungsten-containing metal film. In some implementations, the process 200 further includes planarizing the electroplated tungsten-containing metal film to planarize the tungsten-containing metal film and remove any excess tungsten-containing metal film.

Figure 3A:
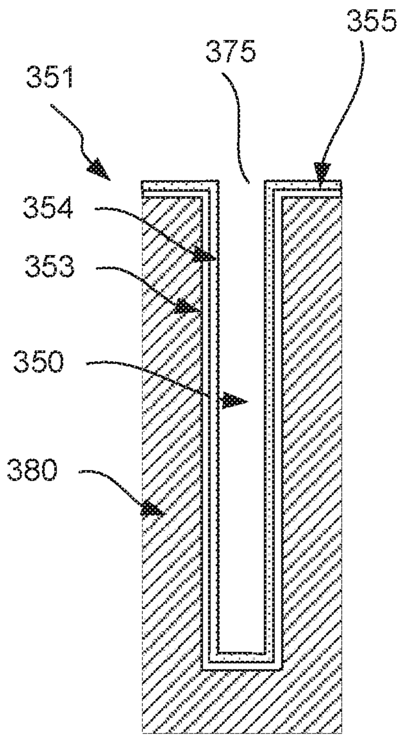
FIGS. 3A-3C show schematic illustrations of various stages of an example process for electroplating a tungsten-containing metal film in a recessed feature of a semiconductor substrate according to some implementations.
Figure 3B:
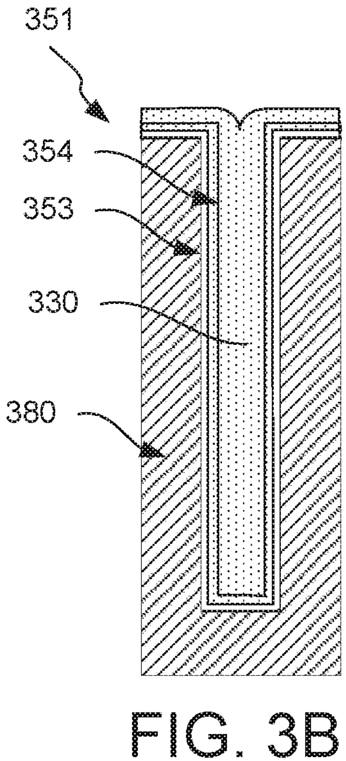
Figure 3C:
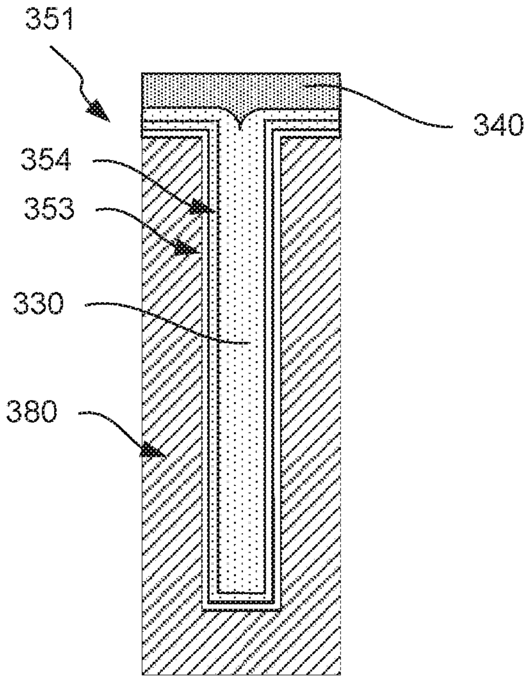

FIGS. 3A-3C show schematic illustrations of an example process for electroplating a tungsten-containing metal film in a recessed feature of a semiconductor substrate according to some implementations.

FIG. 3A shows a cross-sectional schematic illustration of an example feature prior to electrodepositing a tungsten-containing metal film in a recessed feature. In this example, a recessed feature 350 is formed in a dielectric layer 380 of a semiconductor substrate 351. The recessed feature 350 has an opening 375 at a top surface 355 of the semiconductor substrate 351. The recessed feature 350 includes a liner layer 353 formed along sidewalls and a bottom surface of the recessed feature 350. For example, the liner layer 353 includes titanium or titanium nitride. Furthermore, a conductive seed layer 354 is formed on sidewalls and a bottom surface of the recessed feature 350, where the conductive seed layer 354 is formed on the liner layer 353. For example, the conductive seed layer 354 includes cobalt.

FIG. 3B shows a cross-sectional schematic illustration of an example feature after electrodepositing a tungsten-containing metal film in the recessed feature of FIG. 3A. A tungsten-containing metal film 330 may be deposited by electroplating in the recessed feature 350 until the recessed feature 350 is filled or at least substantially filled. In some implementations, the tungsten-containing metal film 330 may be deposited in the recessed feature 350 until at least a feature corner (the point at which the semiconductor substrate 351 transitions from a planar region to the recessed feature 350) is covered with the tungsten-containing metal film 330. The tungsten-containing metal film 330 may be electroplated on the conductive seed layer 354. In some implementations, the tungsten-containing metal film 330 includes cobalt, nickel, or combinations thereof, where a cobalt, nickel, or cobalt-nickel content in the tungsten-containing metal film 330 is substantially greater than a tungsten content in the tungsten-containing metal film 330. The tungsten content in the tungsten-containing metal film 330 may be equal to or less than about 20 atomic %, equal to or less than about 15 atomic %, equal to or less than about 12 atomic %, or equal to or less than about 10 atomic %.

FIG. 3C shows a cross-sectional schematic illustration of an example feature after depositing an overburden layer on the tungsten-containing metal film 330 of FIG. 3B. An overburden layer 340 may be deposited over the top surface 355 of the semiconductor substrate 351 and over the tungsten-containing metal film 330. The overburden layer 340 may include tungsten. In some implementations, the overburden layer 340 may further include cobalt, nickel, or combinations thereof. The overburden layer 340 may be subsequently removed or planarized by a planarization process such as chemical mechanical planarization (CMP).

Figure 4:
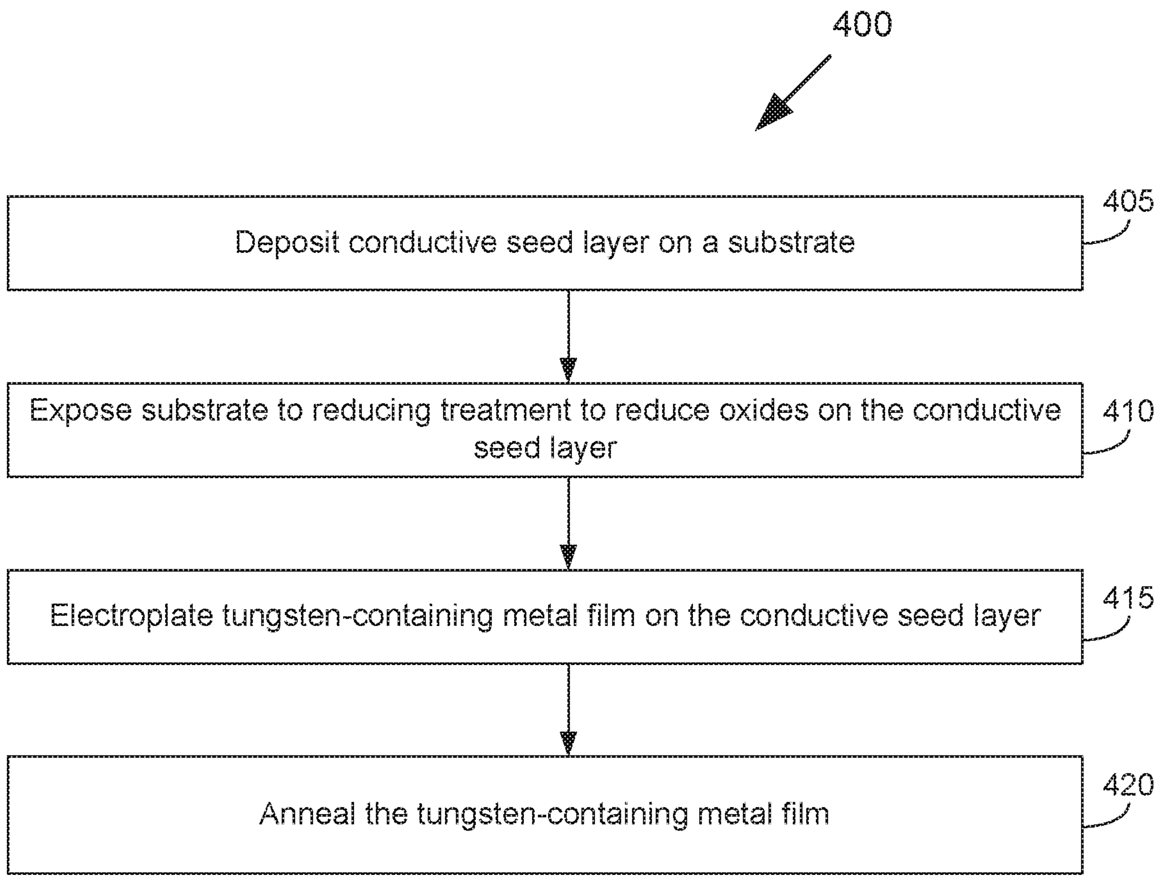
FIG. 4 shows a flow diagram of an example process for electroplating a tungsten-containing metal film including pre-plating and post-plating operations according to some implementations.

FIG. 4 shows a flow diagram of an example process for electroplating a tungsten-containing metal film including pre-plating and post-plating operations according to some implementations. Such pre-plating operations and/or post-plating operations may be performed in conjunction with the process 200 shown in FIG. 2 for electroplating a tungsten-containing metal film. Operations of a process 400 shown in FIG. 4 may include additional, fewer, or different operations. One or more operations of the process 400 shown in FIG. 4 may be performed by any one of the apparatuses described in FIGS. 11-13.

At block 405 of the process 400, a conductive seed layer is deposited on a substrate. The conductive seed layer may be deposited by any suitable deposition technique such as PVD, ALD, or CVD. In some implementations, the conductive seed layer includes cobalt. In some implementations, a thickness of the conductive seed layer is between about 10-100 Å, for example between about 15-30 Å, or between about 30-50 Å. The conductive seed layer may be deposited in one or more recessed features of the substrate.

In many cases, the conductive seed layer is oxidized, which can deleteriously affect subsequent electroplating process and results. Such oxidation may result from a reaction between the conductive seed layer and oxygen or water vapor present in the atmosphere to which the substrate is exposed. The conductive seed layer may be treated prior to electroplating to reduce surface oxides and remove other impurities.

At block 410 of the process 400, the substrate is exposed to a reducing treatment to reduce oxides on the conductive seed layer. In some implementations, the substrate is exposed to a remote plasma treatment process using a reducing gas species. For example, the reducing gas species can include a hydrogen-based gas such as hydrogen ($H_2$) and ammonia ($NH_3$). A remote plasma source may generate radicals of the reducing gas species, where the substrate is exposed to the radicals of the reducing gas species so that metal oxides are reduced to pure metal. In some implementations, the substrate is exposed to an anneal treatment process using a reducing gas species. For example, a reducing gas species may be flowed towards the substrate, where a chamber is maintained at an elevated temperature. In some implementations, the chamber in which anneal occurs may be maintained between about 75-400° C. Examples of reducing gas species include but are not limited to $H_2$, $NH_3$, carbon monoxide (CO), dihorane ($B_2H_6$), sulfite compounds, carbon and/or hydrocarbons, phosphites, and hydrazine ($N_2H_4$). The anneal treatment process exposes the substrate to a thermal forming gas anneal to reduce metal oxides to metal. After the substrate is exposed to a reducing treatment, the substrate may be transferred to an electroplating apparatus or chamber to contact the substrate with an electroplating solution.

At block 415 of the process 400, a tungsten-containing metal film is electroplated on the conductive seed layer. The tungsten-containing metal film may be electroplated as described above in the process 200 of FIG. 2. The substrate may be immersed in an electroplating solution containing a tungstate compound while being cathodically biased. The electroplating solution contains a cobalt salt and/or nickel salt in addition to the tungstate compound. Tungsten-containing metal film is electroplated in the one or more recessed features of the substrate. The tungsten-containing metal film may include tungsten at relatively low concentrations and cobalt, nickel, or combinations thereof at relatively high concentrations. In some implementations, a tungsten content of the tungsten-containing metal film is between about 1-20 atomic %, between about 1-15 atomic %, between about 2-15 atomic %, between about 2-12 atomic %, or between about 3-12 atomic %. In some implementations, the tungsten-containing metal film is cobalt tungsten having tungsten content between about 1-15 atomic %. The tungsten-containing metal film may be substantially free of oxides. The tungsten-containing metal film may be electroplated under electroplating conditions to promote formation of the tungsten-containing metal film substantially free of oxides, where the electroplating conditions may control pH, current density, tungsten concentration, and other parameters. The tungsten-containing metal film may be deposited in one or more recessed features of the substrate to electrochemically fill the one or more recessed features.

At block 420 of the process 400, the tungsten-containing metal film is annealed. After annealing, the average grain size of the electroplated tungsten-containing metal film may be comparatively smaller than an electroplated cobalt metal film after annealing. In some implementations, the average grain size of the tungsten-containing metal film may be between about 20-100 nm, between about 25-75 nm, or between about 30-50 nm.

Data

Figure 5:
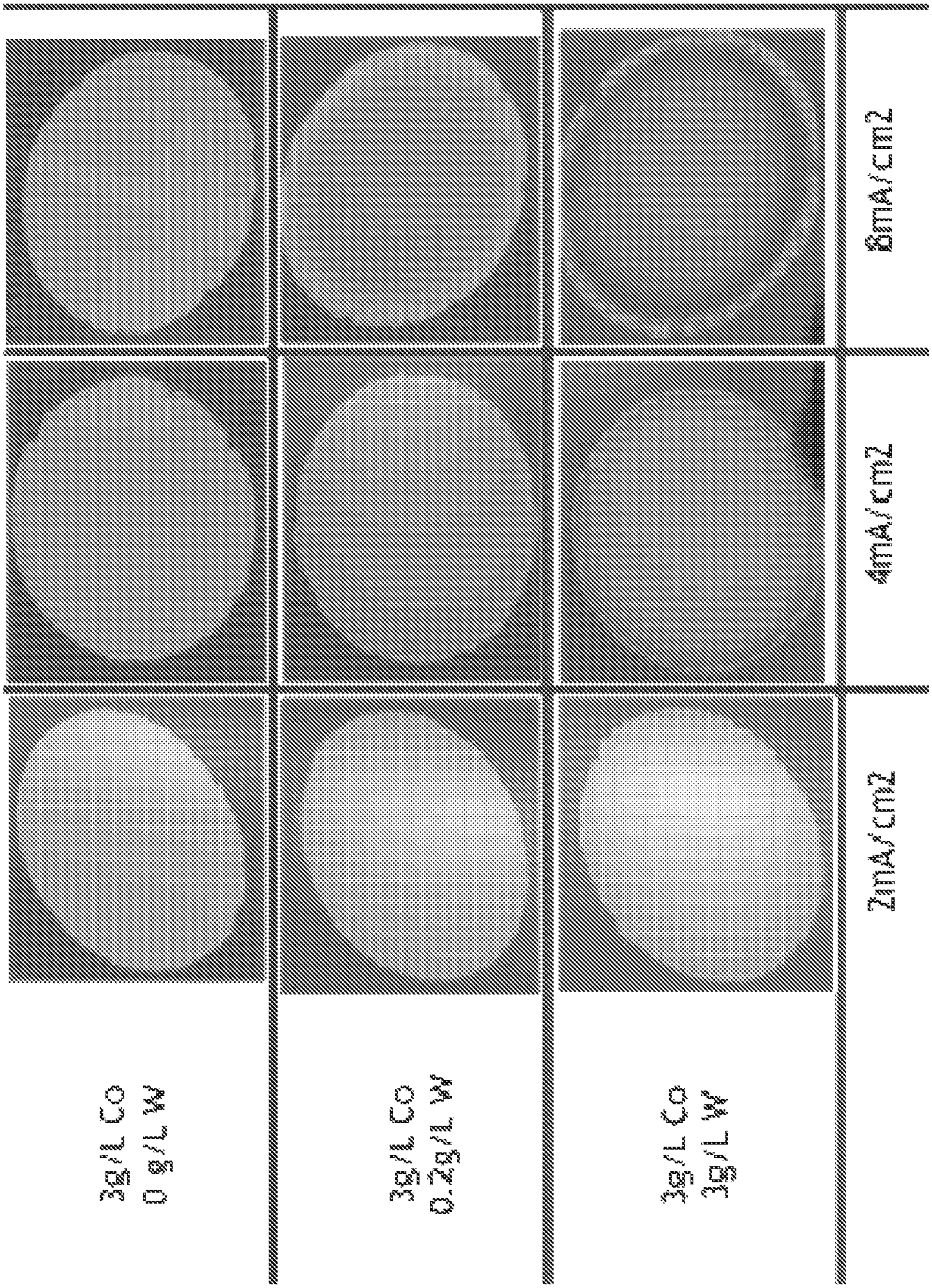
FIG. 5 shows images of semiconductor substrates having cobalt tungsten film deposited thereon using different amounts of tungsten in the electrolyte and different current densities.

FIG. 5 shows images of semiconductor substrates having cobalt tungsten film deposited thereon using different amounts of tungsten in the electrolyte and different current densities. Cobalt tungsten films were deposited on semiconductor substrates with recessed features. Current density was increased with increasing tungsten concentration in the electrolyte. Cobalt concentration in the electrolyte was held constant at 3 g/L. As current density increased with increasing tungsten concentration, outer regions of the semiconductor substrate appeared darker in color. It is believed that the outer regions that appear darker in color are indicative of regions without plated metal and are indicative of the presence of unwanted oxides. Having some tungsten concentration along with higher current density, plated cobalt tungsten films appear worse and result in greater oxide formation. Having high current density along with higher tungsten concentration, plated cobalt tungsten films appear worse and result in greater oxide formation. However, low current density (2 mA/cm$^2$) can tolerate even a high concentration of tungsten (e.g., 3 g/L).

Figure 6:
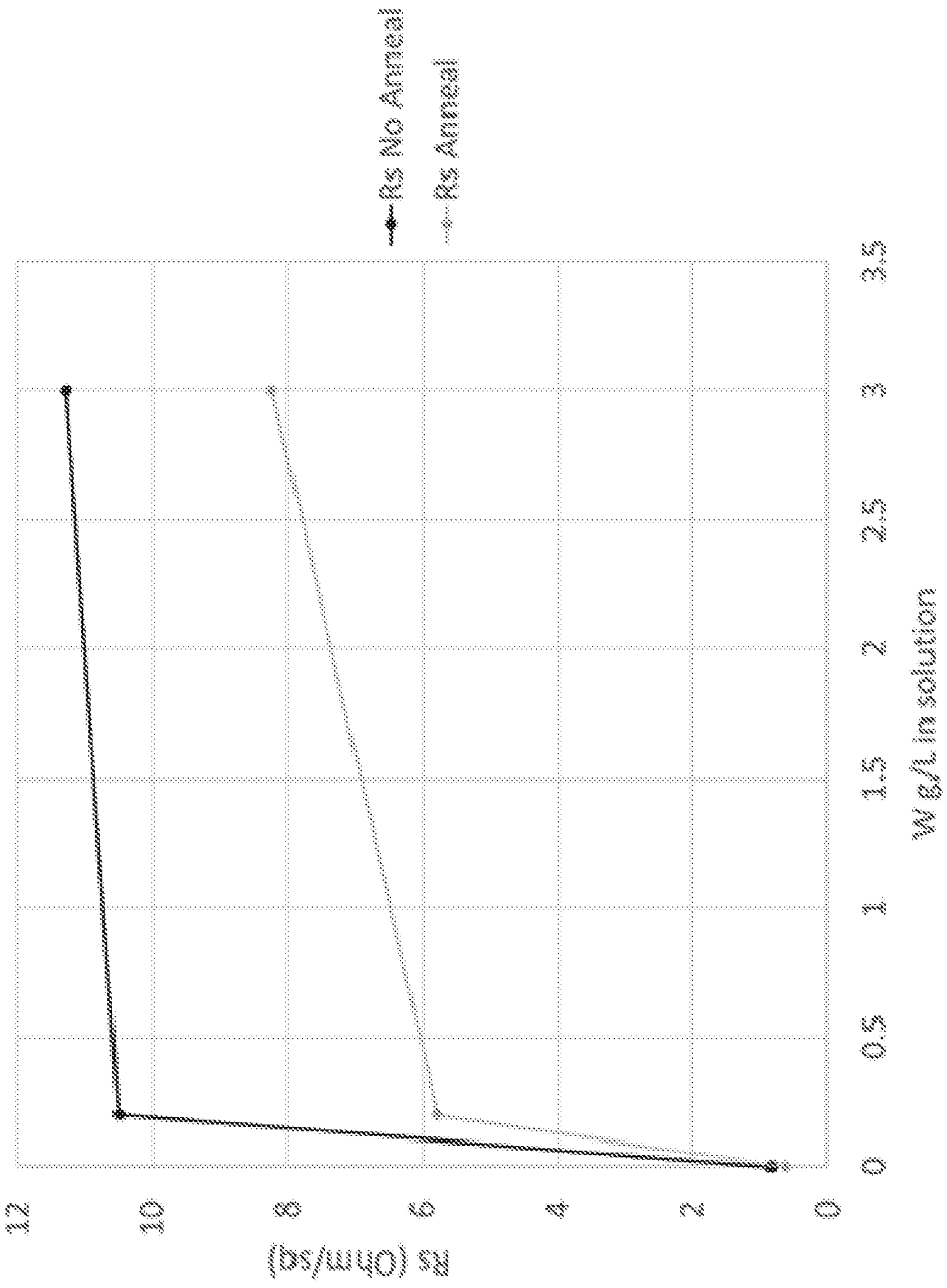
FIG. 6 shows a graph measuring sheet resistance of a semiconductor substrate having cobalt tungsten as a function of tungsten concentration, where different plots are shown with and without thermal anneal.

FIG. 6 shows a graph measuring sheet resistance of a semiconductor substrate having cobalt tungsten as a function of tungsten concentration, where different plots are shown with and without thermal anneal. Cobalt tungsten was plated on semiconductor substrates with the following concentrations in the electrolyte: (i) 3 g/L Co and 0 g/L. W, (ii) 3 g/L Co and 0.2 g/L W, and (iii) 3 g/L Co and 3 g/L W. Electroplating was performed at a current density of 2 mA/cm$^2$. Each of the semiconductor substrates was measured for sheet resistance (Rs). Tungsten incorporation into cobalt films can be detected by increases in sheet resistance. Sheet resistance measurements were taken for semiconductor substrates with a post-electrofill anneal treatment and without a post-electrofill anneal treatment to account for sheet resistance changes due to the presence of oxides. As indicated in FIG. 6, a sharp increase in sheet resistance accompanied the addition of a tungstate compound in the electrolyte, regardless of whether the semiconductor substrate had undergone a post-electrofill anneal treatment or not. This indicates the presence of cobalt tungsten even after thermal cycling.

Figure 7:
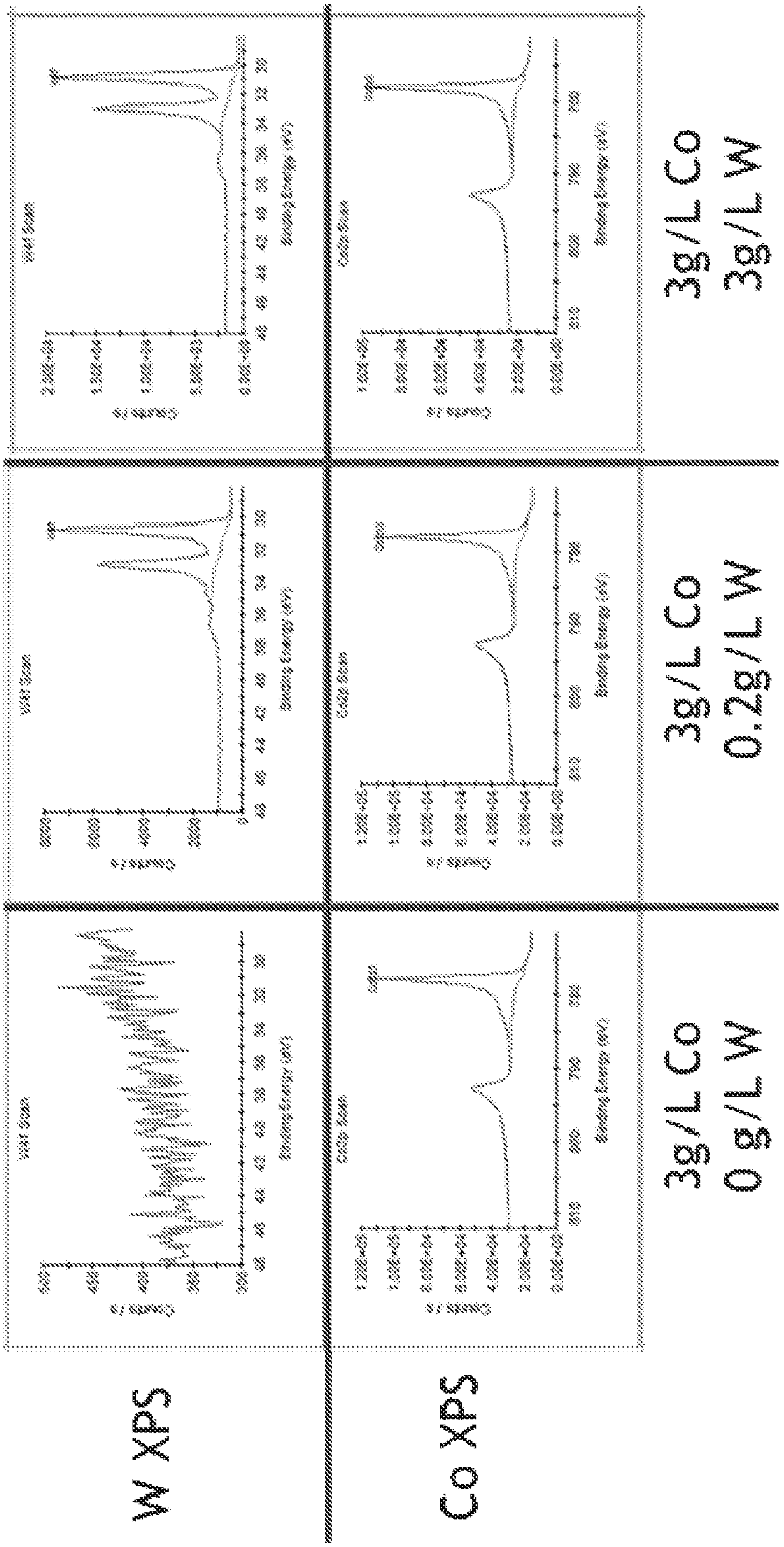
FIG. 7 shows x-ray photoelectron spectroscopy (XPS) profiles for cobalt and tungsten for different amounts of tungsten in the electrolyte.

FIG. 7 shows x-ray photoelectron spectroscopy (XPS) profiles for cobalt and tungsten for different amounts of tungsten in the electrolyte. Cobalt tungsten was plated on semiconductor substrates with the following concentrations in the electrolyte: (i) 3 g/L Co and 0 g/L W, (ii) 3 g/L Co and 0.2 g/L W, and (iii) 3 g/L Co and 3 g/L W. Electroplating was performed at a current density of 2 mA/cm$^2$. XPS data for each of the aforementioned samples was obtained and compared against XPS profiles of published data for cobalt, cobalt oxide, tungsten, and tungsten oxide. That way, the elemental composition of the samples can be determined. The only signals observed were those of metallic cobalt and metallic tungsten, and the presence of cobalt oxide and tungsten oxide was not observed. The data in FIG. 7 confirmed that the electrolyte generated metallic cobalt tungsten films and that it was possible to tune the atomic percentage content of tungsten in the metallic cobalt tungsten films. As shown in the XPS profiles and in Table 3 below, increase the concentration of tungsten in the electrolyte generates metallic cobalt tungsten films with increased tungsten content.

TABLE 3

| Sample | Co (atomic %) | W (atomic %) | C (atomic %) |
|---|---|---|---|
| 3 g/L Co, 0 g/L W | 98.2 | 0 | 1.8 |
| 3 g/L Co, 0.2 g/L W | 94.2 | 4.0 | 1.8 |
| 3 g/L Co, 3 g/L W | 86.6 | 11.7 | 1.7 |

Figure 8:
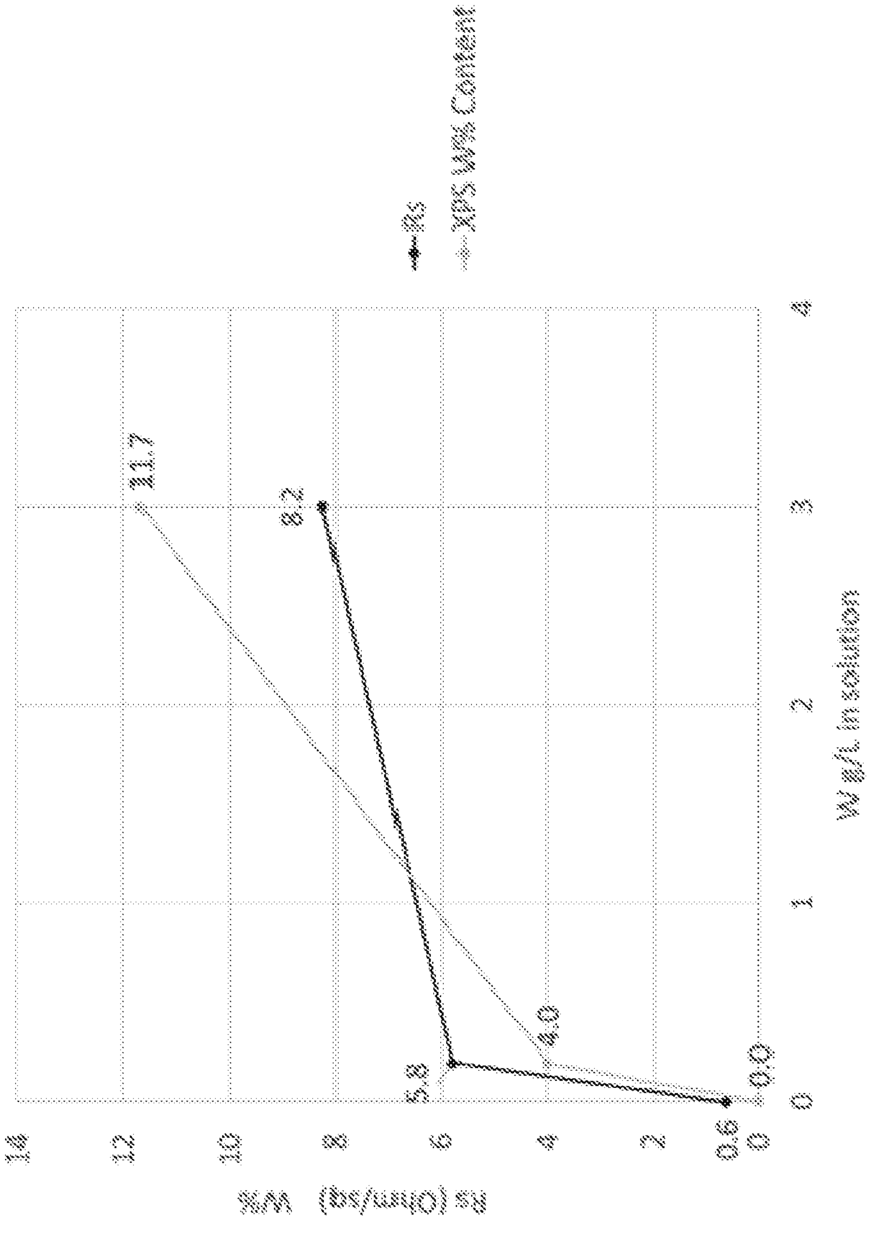
FIG. 8 shows a graph measuring sheet resistance of a semiconductor substrate having cobalt tungsten as a function of tungsten concentration.

FIG. 8 shows a graph measuring sheet resistance of a semiconductor substrate having cobalt tungsten as a function of tungsten concentration. Based on the samples in Table 3, sheet resistance was measured for cobalt tungsten films having a tungsten content of 0 atomic %, 4.0 atomic and 11.7 atomic %. Sheet resistance increased with increasing tungsten content.

Figure 9:
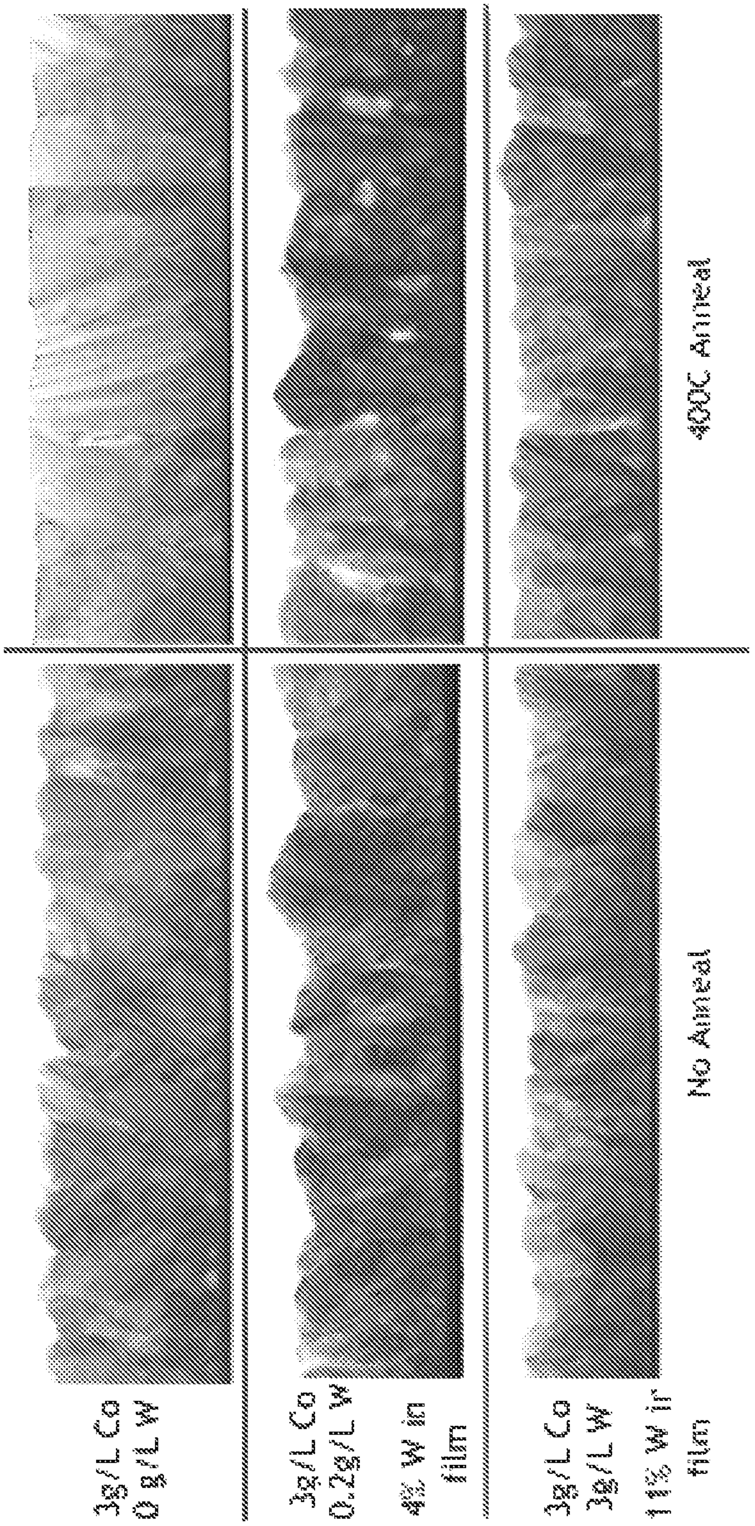
FIG. 9 shows SEM images of grain structures of electroplated cobalt tungsten films with and without anneal for different tungsten atomic percentages.

FIG. 9 shows SEM images of grain structures of electroplated cobalt tungsten films with and without anneal for different tungsten atomic percentages. Large grains are observed in cobalt films without tungsten, and smaller grains are observed in cobalt tungsten films with increasing tungsten concentration. Without tungsten, average grain size after anneal may be undesirably large. With tungsten, average grain size after anneal may be acceptably small.

Figure 10:
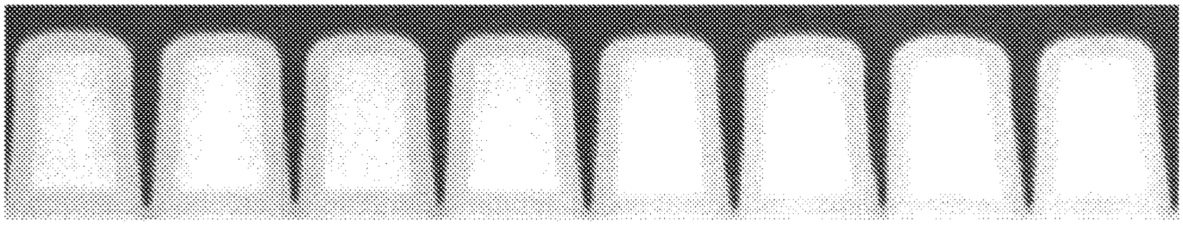
FIG. 10 shows SEM images of recessed features filled with cobalt and with cobalt tungsten alloy.
Figure 10:
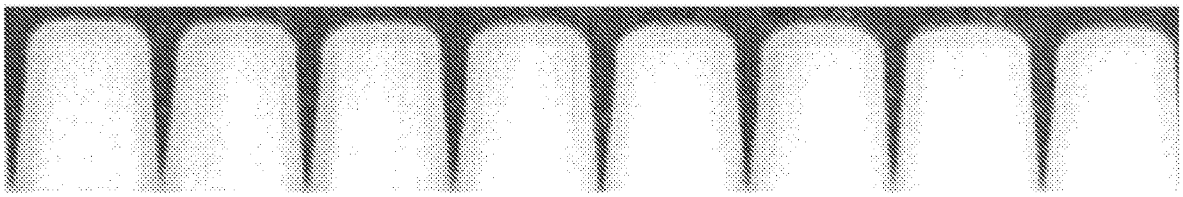

FIG. 10 shows SEM images of recessed features filled with cobalt and with cobalt tungsten alloy. Recessed features are filled with cobalt film having no tungsten and with cobalt tungsten film having 4 atomic % of tungsten (0.2 g/L W in electrolyte). As shown in FIG. 10, feature fill with cobalt tungsten can be accomplished just as effectively or nearly as effectively as feature fill with cobalt.

Electroplating Apparatus

The methods described herein may be performed by any suitable apparatus. A suitable apparatus includes hardware for accomplishing the process operations and a system controller having instructions for controlling process operations in accordance with the present implementations. For example, in some implementations, the hardware may include one or more process stations included in a process tool.

Figure 11:
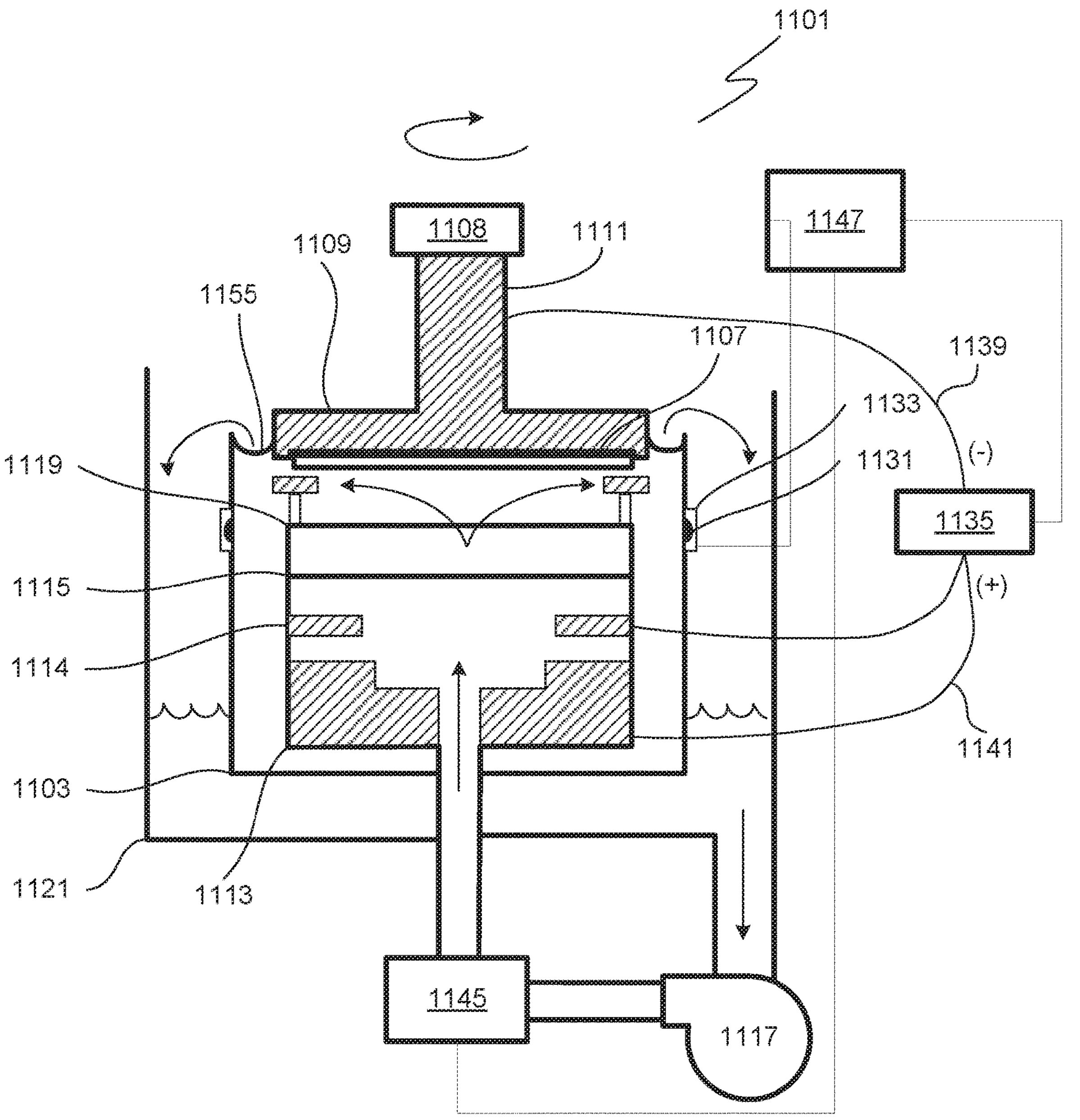
FIG. 11 shows a simplified schematic diagram of an example electroplating apparatus with an electroplating cell according to some implementations.

One example apparatus for performing the disclosed methods is shown in FIG. 11. The apparatus includes one or more electroplating cells in which the substrates (e.g., wafers) are processed. Only a single electroplating cell is shown in FIG. 11 to preserve clarity. To optimize bottom-up electroplating, additives (e.g., accelerators and/or suppressors) may be added to the electrolyte as described herein; however, an electrolyte with additives may react with the anode in undesirable ways. Therefore anodic and cathodic regions of the plating cell are sometimes separated by a membrane so that plating solutions of different composition may be used in each region. Plating solution in the cathodic region is called catholyte; and in the anodic region, analyte. A number of engineering designs can be used in order to introduce analyte and catholyte into the plating apparatus.

Referring to FIG. 11, a diagrammatical cross-sectional view of an electroplating apparatus 1101 in accordance with one implementation is shown. The electroplating apparatus 1101 includes an electroplating chamber or plating bath 1103 configured to hold an electroplating solution. The plating bath 1103 contains the electroplating solution (having a composition as described herein), which is shown at a level 1155. The catholyte portion of this vessel is adapted for receiving substrates in a catholyte. The electroplating apparatus 1101 may further include a substrate holder or "clamshell" holding fixture 1109 configured to hold a semiconductor substrate or wafer 1107 in the electroplating solution. The wafer 1107 is immersed into the electroplating solution and is held by, e.g., the "clamshell" holding fixture 1109, mounted on a rotatable spindle 1111, which allows rotation of "clamshell" holding fixture 1109 together with the wafer 1107. A general description of a clamshell-type plating apparatus having aspects suitable for use with this invention is described in detail in U.S. Pat. No. 6,156,167 issued to Patton et al., and U.S. Pat. No. 6,800,187 issued to Reid et al., which are incorporated herein by reference in their entireties and for all purposes.

An anode 1113 is disposed below the wafer 1107 within the plating bath 1103 and is separated from the wafer region by a membrane 1165, such as an ion selective membrane. For example, Nafion™ cationic exchange membrane (CEM) may be used. The region below the anodic membrane is often referred to as an "anode chamber." The ion-selective anode membrane 1165 allows ionic communication between the anodic and cathodic regions of the plating cell, while preventing the particles generated at the anode from entering the proximity of the wafer 1107 and contaminating it. The anode membrane 1165 is also useful in redistributing current flow during the plating process and thereby improving the plating uniformity. Detailed descriptions of suitable anodic membranes are provided in U.S. Pat. Nos. 6,126,798 and 6,569,299 issued to Reid et al., both incorporated herein by reference in their entireties and for all purposes. Ion exchange membranes, such as cationic exchange membranes are especially suitable for these applications. These membranes are typically made of ionomeric materials, such as perfluorinated co-polymers containing sulfonic groups (e.g. Nafion™), sulfonated polyimides, and other materials known to those of skill in the art to be suitable for cation exchange. Selected examples of suitable Nafion™ membranes include N324 and N424 membranes available from Dupont de Nemours Co.

During plating, the ions from the electroplating solution are deposited on the wafer 1107. The metal ions must diffuse through the diffusion boundary layer and into the recessed feature (if present). A typical way to assist the diffusion is through convection flow of the electroplating solution provided by the pump 1117. Additionally, a vibration agitation or sonic agitation member may be used as well as wafer rotation. For example, a vibration transducer 1108 may be attached to the wafer chuck 1109.

The electroplating solution is continuously provided to plating bath 1103 by the pump 1117. Generally, the electroplating solution flows upwards through the anode membrane 1165 and a diffuser plate 1119 to the center of wafer 1107 and then radially outward and across the wafer 1107. The electroplating solution also may be provided into anodic region of the plating bath 1103 from the side of the plating bath 1103. The electroplating solution then overflows plating bath 1103 to an overflow reservoir 1121. The electroplating solution is then filtered (not shown) and returned to pump 1117 completing the recirculation of the electroplating solution. In certain configurations of the plating cell, a distinct electrolyte is circulated through the portion of the plating cell in which the anode is contained while mixing with the main electroplating solution is prevented using sparingly permeable membranes or ion selective membranes.

A reference electrode 1131 is located on the outside of the plating bath 1103 in a separate chamber 1133, which chamber is replenished by overflow from the main plating bath 1103. Alternatively, in some implementations, the reference electrode 1131 is positioned as close to the wafer surface as possible, and the reference electrode chamber is connected via a capillary tube or by another method, to the side of the wafer substrate or directly under the wafer substrate. In some implementations, the electroplating apparatus 1101 further includes contact sense leads that connect to the wafer periphery and which are configured to sense the potential of the metal seed layer at the periphery of the wafer 1107 but do not carry any current to the wafer 1107.

A reference electrode 1131 may be employed to facilitate electroplating at a controlled potential. The reference electrode 1131 may be one of a variety of commonly used types such as mercury/mercury sulfate, silver chloride, saturated calomel, or copper metal. A contact sense lead in direct contact with the wafer 1107 may be used in some implementations, in addition to the reference electrode 1131, for more accurate potential measurement (not shown).

In some implementations, the electroplating apparatus 1101 further includes a power supply 1135. The power supply 1135 can be used to control current flow to the wafer 1107. The power supply 1135 has a negative output lead 1139 electrically connected to wafer 1107 through one or more slip rings, brushes and contacts (not shown). The positive output lead 1141 of power supply 1135 is electrically connected to an anode 1113 located in plating bath 1103. The power supply 1135, the reference electrode 1131, and a contact sense lead (not shown) can be connected to a system controller 1147, which allows, among other functions, modulation of current and potential provided to the elements of electroplating cell. For example, the controller 1147 may allow electroplating in potential-controlled and current-controlled regimes. The controller 1147 may include program instructions specifying current and voltage levels that need to be applied to various elements of the plating cell, as well as times at which these levels need to be changed. When forward current is applied, the power supply 1135 biases the wafer 1107 to have a negative potential relative to anode 1113. This causes an electrical current to flow from anode 1113 to the water 1107, and an electrochemical reduction reaction occurs on the wafer surface (the cathode), which results in the deposition of the tungsten-containing metal film on the surfaces of the wafer 1107. In some implementations, the tungsten-containing metal film is a cobalt tungsten film. An inert anode 1114 may be installed below the wafer 1107 within the plating bath 1103 and separated from the wafer region by the membrane 1165.

The electroplating apparatus 1101 may also include a heater 1145 for maintaining the temperature of the electroplating solution at a specific level. The electroplating solution may be used to transfer the heat to the other elements of the plating bath 1103. For example, when a wafer 1107 is loaded into the plating bath 1103, the heater 1145 and the pump 1117 may be turned on to circulate the electroplating solution through the electroplating apparatus 1101, until the temperature throughout the apparatus 1101 becomes substantially uniform. In one implementation, the heater 1145 is connected to the system controller 1147. The system controller 1147 may be connected to a thermocouple to receive feedback of the electroplating solution temperature within the electroplating apparatus 1101 and determine the need for additional heating.

The controller 1147 will typically include one or more memory devices and one or more processors. The processor may include a CPU or computer, analog and/or digital input/output connections, stepper motor controller boards, etc. In certain implementations, the controller 1147 controls all of the activities of the electroplating apparatus 1101 and/or of a pre-wetting chamber used to wet the surface of the substrate before electroplating begins. The controller 1147 may also control all the activities of an apparatus used to deposit a conductive seed layer, as well as all of the activities involved in transferring the substrate between the relevant apparatuses.

For example, the controller 1147 may include instructions for depositing a conductive seed layer, transferring the conductive seed layer to a pre-treatment chamber, performing pre-treatment, and electroplating in accordance with any method described above or in the appended claims. Non-transitory machine-readable media containing instructions for controlling process operations in accordance with the present disclosure may be coupled to the controller 1147.

Typically there will be a user interface associated with controller 1147. The user interface may include a display screen, graphical software displays of the apparatus and/or process conditions, and user input devices such as pointing devices, keyboards, touch screens, microphones, etc.

The computer program code for controlling electroplating processes can be written in any conventional computer readable programming language: for example, assembly language, C, C++, Pascal, Fortran or others. Compiled object code or script is executed by the processor to perform the tasks identified in the program.

In some implementations, the electroplating apparatus 1101 includes the controller 1147 configured with program instructions for performing the following operations: contacting a semiconductor substrate with an electroplating solution, wherein the semiconductor substrate has a plurality of recessed features, and wherein the electroplating solution comprises a source of tungsten and a source of a metal selected from a group consisting of cobalt, nickel, and combinations thereof, and cathodically biasing the semiconductor substrate to electroplate the tungsten-containing metal film and electrochemically fill the plurality of recessed features with the tungsten-containing metal film, where a tungsten content in the tungsten-containing metal film is between about 1-20 atomic %. In some implementations, the program instructions for performing cathodically biasing the semiconductor substrate to electroplate the tungsten-containing metal film comprise program instructions for providing a current density between about 0.25-12 $mA/cm^2$.

Figure 12:
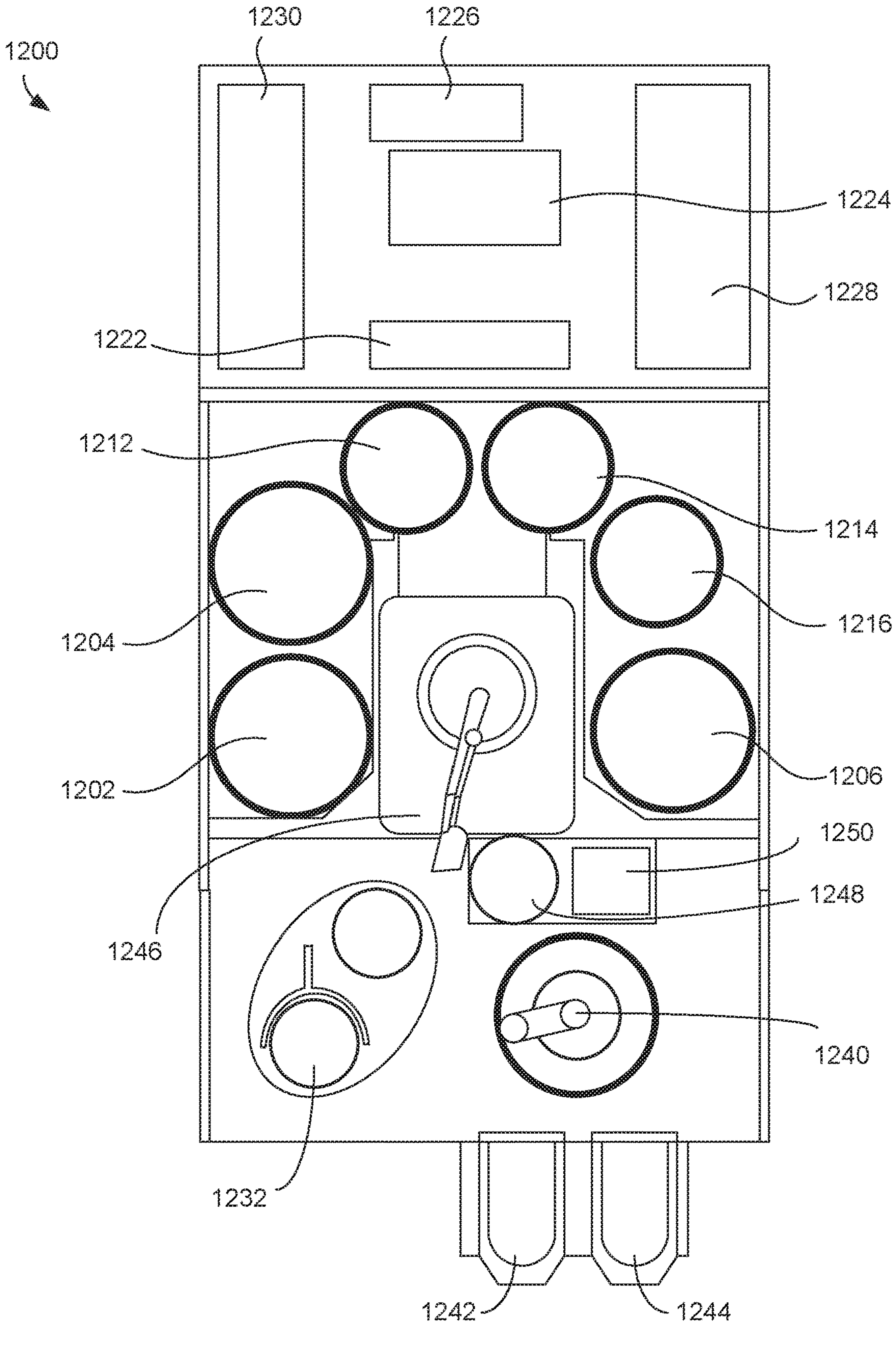
FIG. 12 shows a schematic of a top view of an example electroplating apparatus according to some implementations.

FIG. 12 shows an example multi-tool apparatus that may be used to implement the implementations herein. The electrodeposition apparatus 1200 can include three separate electroplating modules 1202, 1204, and 1206. Further, three separate modules 1212, 1214 and 1216 may be configured for various process operations. For example, in some embodiments, one or more of modules 1212, 1214, and 1216 may be a spin rinse drying (SRD) module. In these or other implementations, one or more of the modules 1212, 1214, and 1216 may be post-electrofill modules (PEMs), each configured to perform a function, such as edge bevel removal, backside etching, and acid cleaning of substrates after they have been processed by one of the electroplating modules 1202, 1204, and 1206. Further, one or more of the modules 1212, 1214, and 1216 may be configured as a pre-treatment chamber. The pre-treatment chamber may be a remote plasma chamber or an anneal chamber as described herein. Alternatively, a pre-treatment chamber may be included at another portion of the apparatus, or in a different apparatus.

The electrodeposition apparatus 1200 includes a central electrodeposition chamber 1224. The central electrodeposition chamber 1224 is a chamber that holds the chemical solution used as the electroplating solution in the electroplating modules 1202, 1204, and 1206. The electrodeposition apparatus 1200 also includes a dosing system 1226 that may store and deliver additives for the electroplating solution. A chemical dilution module 1222 may store and mix chemicals to be used as an etchant. A filtration and pumping unit 1228 may filter the electroplating solution for the central electrodeposition chamber 1224 and pump it to the electroplating modules.

A system controller 1230 provides electronic and interface controls used to operate the electrodeposition apparatus 1200. Aspects of the system controller 1230 are discussed above in the controller 1147 of FIG. 11, and are described further herein. The system controller 1230 (which may include one or more physical or logical controllers) controls some or all of the properties of the electrodeposition apparatus 1200. The system controller 1230 typically includes one or more memory devices and one or more processors. The processor may include a central processing unit (CPU) or computer, analog and/or digital input/output connections, stepper motor controller boards, and other like components. Instructions for implementing appropriate control operations as described herein may be executed on the processor. These instructions may be stored on the memory devices associated with the system controller 1230 or they may be provided over a network. In certain implementations, the system controller 1230 executes system control software.

The system control software in the electrodeposition apparatus 1200 may include instructions for controlling the timing, mixture of electrolyte components (including the concentration of one or more electrolyte components), electrolyte gas concentrations, inlet pressure, plating cell pressure, plating cell temperature, substrate temperature, current and potential applied to the substrate and any other electrodes, substrate position, substrate rotation, and other parameters of a particular process performed by the electrodeposition apparatus 1200.

In some implementations, there may be a user interface associated with the system controller 1230. The user interface may include a display screen, graphical software displays of the apparatus and/or process conditions, and user input devices such as pointing devices, keyboards, touch screens, microphones, etc.

In some implementations, parameters adjusted by the system controller 1230 may relate to process conditions. Non-limiting examples include solution conditions (temperature, composition, and flow rate), substrate position (rotation rate, linear (vertical) speed, angle from horizontal) at various stages, etc. These parameters may be provided to the user in the form of a recipe, which may be entered utilizing the user interface.

Signals for monitoring the process may be provided by analog and/or digital input connections of the system controller 1230 from various process tool sensors. The signals for controlling the process may be output on the analog and digital output connections of the process tool. Non-limiting examples of process tool sensors that may be monitored include mass flow controllers, pressure sensors (such as manometers), thermocouples, optical position sensors, etc. Appropriately programmed feedback and control algorithms may be used with data from these sensors to maintain process conditions.

In one implementation of a multi-tool apparatus, the instructions can include inserting the substrate in a wafer holder, tilting the substrate, biasing the substrate during immersion, and electrodepositing a tungsten-containing metal film (e.g., cobalt tungsten) on a substrate. The instructions may further include pre-treating the substrate, annealing the substrate after electroplating, and transferring the substrate as appropriate between relevant apparatus.

A hand-off tool 1240 may select a substrate from a substrate cassette such as the cassette 1242 or the cassette 1244. The cassettes 1242 or 1244 may be front opening unified pods (FOUPs). A FOUP is an enclosure designed to hold substrates securely and safely in a controlled environment and to allow the substrates to be removed for processing or measurement by tools equipped with appropriate load ports and robotic handling systems. The hand-off tool 940 may hold the substrate using a vacuum attachment or some other attaching mechanism.

The hand-off tool 1240 may interface with a wafer handling station 1232, the cassettes 1242 or 1244, a transfer station 1250, or an aligner 1248. From the transfer station 1250, a hand-off tool 1246 may gain access to the substrate. The transfer station 1250 may be a slot or a position from and to which hand-off tools 1240 and 1246 may pass substrates without going through the aligner 1248. In some implementations, however, to ensure that a substrate is properly aligned on the hand-off tool 1246 for precision delivery to an electroplating module, the hand-off tool 1246 may align the substrate with an aligner 1248. The hand-off tool 1246 may also deliver a substrate to one of the electroplating modules 1202, 1204, or 1206, or to one of the separate modules 1212, 1214 and 1216 configured for various process operations.

An apparatus configured to allow efficient cycling of substrates through sequential plating, rinsing, drying, and PEM process operations may be useful for implementations for use in a manufacturing environment. To accomplish this, the module 1212 can be configured as a spin rinse dryer and an edge bevel removal chamber. With such a module 1212, the substrate would only need to be transported between the electroplating module 1204 and the module 1212 for the metal plating and edge bevel removal (EBR) operations. One or more internal portions of the apparatus 1200 may be under sub-atmospheric conditions. For instance, in some implementations, the entire area enclosing the plating cells 1202, 1204 and 1206 and the PEMs 1212, 1214 and 1216 may be under vacuum. In other implementations, an area enclosing only the plating cells is under vacuum. In further implementations, the individual plating cells may be under vacuum. While electrolyte flow loops are not shown in FIG. 12 or 13, it is understood that the flow loops described herein may be implemented as part of (or in conjunction with) a multi-tool apparatus.

Figure 13:
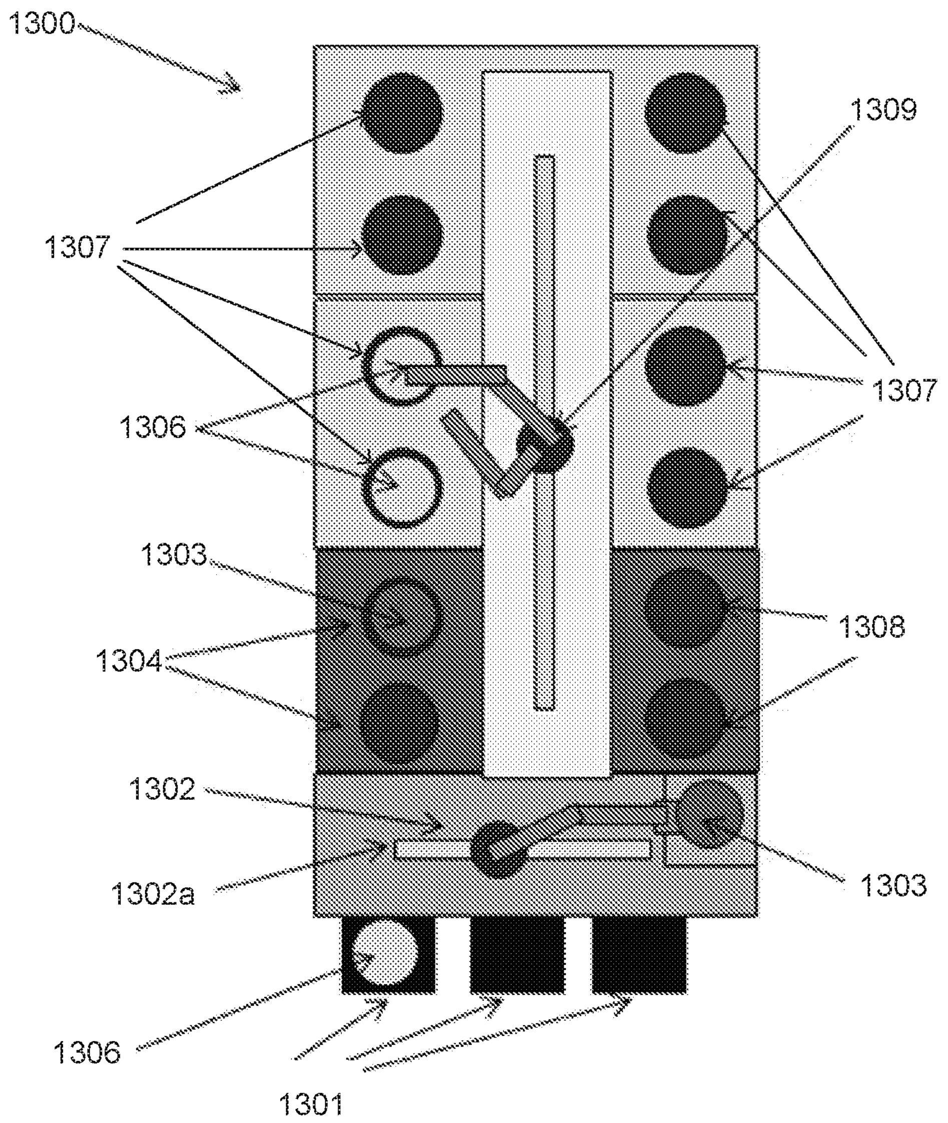
FIG. 13 shows a schematic of a top view of an alternative example electroplating apparatus according to some implementations.

FIG. 13 shows an additional example of a multi-tool apparatus that may be used in implementing the implementations herein. In this implementation, the electrodeposition apparatus 1300 has a set of electroplating cells 1307, each containing an electroplating bath, in a paired or multiple “duet” configuration. In addition to electroplating per se, the electrodeposition apparatus 1300 may perform a variety of other electroplating related processes and sub-steps, such as spin-rinsing, spin-drying, metal and silicon wet etching, electroless deposition, pre-wetting and pre-chemical treating, reducing, annealing, photoresist stripping, and surface pre-activation, for example. The electrodeposition apparatus 1300 is shown schematically looking top down, and only a single level or “floor” is revealed in the figure, but it is to be readily understood by one having ordinary skill in the art that such an apparatus, e.g., the Sabre™ 3D tool of Lam Research Corporation of Fremont, CA can have two or more levels “stacked” on top of each other, each potentially having identical or different types of processing stations.

Referring once again to FIG. 13, the substrates 1306 that are to be electroplated are generally fed to the electrodeposition apparatus 1300 through a front end loading FOUP 1301 and, in this example, are brought from the RAW to the main substrate processing area of the electrodeposition apparatus 1300 via a front-end robot 1302 that can retract and move a substrate 1306 driven by a spindle 1303 in multiple dimensions from one station to another of the accessible stations two front-end accessible stations 1304 and also two front-end accessible stations 1308 are shown in this example. The front-end accessible stations 1304 and 1308 may include, for example, pre-treatment stations, and spin rinse drying (SRD) stations. These stations 1304 and 1308 may also be removal stations as described herein. Lateral movement from side-to-side of the front-end robot 1302 is accomplished utilizing robot track 1302*a*. Each of the substrates 1306 may be held by a cup/cone assembly (not shown) driven by a spindle 1303 connected to a motor (not shown), and the motor may be attached to a mounting bracket 1309. Also shown in this example are the four “duets” of electroplating cells 1307, for a total of eight electroplating cells 1307. The electroplating cells 1307 may be used for electroplating a tungsten-containing metal film (e.g., cobalt tungsten) and electroplating solder material for the solder structure (among other possible materials). A system controller (not shown) may be coupled to the electrodeposition apparatus 1300 to control some or all of the properties of the electrodeposition apparatus 1300. The system controller may be programmed or otherwise configured to execute instructions according to processes described earlier herein.

In some implementations, a controller is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some implementations, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

The various hardware and method embodiments described above may be used in conjunction with lithographic patterning tools or processes, for example, for the fabrication or manufacture of semiconductor devices, displays, LEDs, photovoltaic panels and the like. Typically, though not necessarily, such tools/processes will be used or conducted together in a common fabrication facility.

Lithographic patterning of a film typically comprises some or all of the following steps, each step enabled with a number of possible tools: (1) application of photoresist on a workpiece, e.g., a substrate having a silicon nitride film formed thereon, using a spin-on or spray-on tool; (2) curing of photoresist using a hot plate or furnace or other suitable curing tool; (3) exposing the photoresist to visible or UV or x-ray light with a tool such as a wafer stepper; (4) developing the resist so as to selectively remove resist and thereby pattern it using a tool such as a wet bench or a spray developer; (5) transferring the resist pattern into an underlying film or workpiece by using a dry or plasma-assisted etching tool; and (6) removing the resist using a tool such as an RF or microwave plasma resist stripper. In some embodiments, an ashable hard mask layer (such as an amorphous carbon layer) and another suitable hard mask (such as an antireflective layer) may be deposited prior to applying the photoresist.

CONCLUSION

In the foregoing description, numerous specific details are set forth to provide a thorough understanding of the presented embodiments. The disclosed embodiments may be practiced without some or all of these specific details. In other instances, well-known process operations have not been described in detail to not unnecessarily obscure the disclosed embodiments. While the disclosed embodiments are described in conjunction with the specific embodiments, it will be understood that it is not intended to limit the disclosed embodiments.

Although the foregoing embodiments have been described in some detail for purposes of clarity of understanding, it will be apparent that certain changes and modifications may be practiced within the scope of the appended claims. It should be noted that there are many alternative ways of implementing the processes, systems, and apparatus of the present embodiments. Accordingly, the present embodiments are to be considered as illustrative and not restrictive, and the embodiments are not to be limited to the details given herein.

What is claimed is:

1. A method of electroplating a tungsten-containing metal film on a semiconductor substrate, the method comprising:

providing a semiconductor substrate to an electroplating apparatus, wherein the semiconductor substrate has at least one recessed feature and comprises an exposed conductive seed layer at least on sidewalls of the at least one recessed feature;

contacting the semiconductor substrate with an electroplating solution in the electroplating apparatus; and cathodically biasing the semiconductor substrate in the electroplating apparatus to electroplate a tungsten-containing metal film and electrochemically fill the at least one recessed feature with the tungsten-containing metal film, wherein the tungsten-containing metal film comprises a metal selected from a group consisting of cobalt, nickel, and combinations thereof, wherein a tungsten content in the tungsten-containing metal film is between about 1-20 atomic %, wherein the electroplating solution has tungsten content equal to or less than about 4 g/L.

2. The method of claim 1, wherein the tungsten-containing metal film is a cobalt tungsten (CoW) film.

3. The method of claim 1, wherein the exposed conductive seed layer is a cobalt seed layer.

4. The method of claim 1, wherein the at least one recessed feature has a width equal to or less than about 40 nm.

5. The method of claim 1, wherein the tungsten-containing metal film has a sheet resistance equal to or less than about 100 micro-ohm/cm.

6. The method of claim 1, further comprising:

annealing the electroplated tungsten-containing metal film.

7. The method of claim 1, wherein the electroplating solution has a pH equal to or less than about 6.

8. The method of claim 1, wherein the electroplating solution has a pH of between about 2-4.

9. The method of claim 1, wherein cathodically biasing the semiconductor substrate to electroplate a tungsten-containing metal film comprises electroplating at a current density equal to or less than about 12 $mA/cm^2$.

10. The method of claim 1, wherein the electroplating solution has tungsten content of equal to or less than about 2 g/L, and wherein cathodically biasing the semiconductor substrate to electroplate a tungsten-containing metal film comprises electroplating at a current density equal to or less than about 8 $mA/cm^2$.

11. The method of claim 1, wherein the electroplating solution comprises a suppressor.

12. The method of claim 1, wherein the tungsten-containing metal film is substantially free of oxide.

* * * * *